(12) United States Patent  
Kubota et al.

(10) Patent No.: US 12,063,802 B2  
(45) Date of Patent: Aug. 13, 2024

(54) DISPLAY APPARATUS, DISPLAY MODULE, AND ELECTRONIC DEVICE

(71) Applicant: Semiconductor Energy Laboratory Co., Ltd., Kanagawa-ken (JP)

(72) Inventors: Daisuke Kubota, Kanagawa (JP); Taisuke Kamada, Saitama (JP); Ryo Hatsumi, Kanagawa (JP); Koji Kusunoki, Kanagawa (JP); Kazunori Watanabe, Tokyo (JP); Susumu Kawashima, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 17/768,150

(22) PCT Filed: Oct. 5, 2020

(86) PCT No.: PCT/IB2020/059314  
§ 371 (c)(1),  
(2) Date: Apr. 11, 2022

(87) PCT Pub. No.: WO2021/074738  
PCT Pub. Date: Apr. 22, 2021

(65) Prior Publication Data  
US 2024/0099038 A1 Mar. 21, 2024

(30) Foreign Application Priority Data  
Oct. 17, 2019 (JP) .................. 2019-190224

(51) Int. Cl.  
*H10K 39/34* (2023.01)  
*H10K 50/858* (2023.01)

(52) U.S. Cl.  
CPC .......... *H10K 39/34* (2023.02); *H10K 50/858* (2023.02)

(58) Field of Classification Search  
CPC ........................ H10K 50/858; H10K 39/34  
(Continued)

(56) References Cited

U.S. PATENT DOCUMENTS 7,750,896 B2   7/2010   Kuroda  
8,310,413 B2   11/2012  Fish et al.  
(Continued)

FOREIGN PATENT DOCUMENTS

CN   001934605 A   3/2007  
JP   2007-529775   10/2007  
(Continued)

OTHER PUBLICATIONS

International Search Report (Application No. PCT/IB2020/059314) Dated Dec. 15, 2020.  
(Continued)

*Primary Examiner* — Christopher M Raabe  
(74) *Attorney, Agent, or Firm* — Husch Blackwell LLP

(57) ABSTRACT

A display apparatus having a photoelectric conversion function with high sensitivity is provided. The light extraction efficiency of the display apparatus is increased. The display apparatus includes a light-emitting device, a light-emitting and light-receiving device, a first lens, and a second lens. The light-emitting device has a function of emitting light of a first color. The light-emitting and light-receiving device has a function of emitting light of a second color and a function of receiving light of the first color and converting it into an electric signal. The light emitted by the light-emitting device is emitted to the outside of the display apparatus through the first lens. Light enters the light-emitting and light-receiving device from the outside of the display apparatus through the second lens.

10 Claims, 12 Drawing Sheets

(58) Field of Classification Search
USPC .......................................................... 257/40
See application file for complete search history.

(56) References Cited

U.S. PATENT DOCUMENTS

| | | | |
|---|---|---|---|
| 9,088,006 B2 | 7/2015 | Yamazaki et al. | |
| 10,032,834 B2 | 7/2018 | Udaka et al. | |
| 11,487,373 B2* | 11/2022 | Kubota | G06V 40/1318 |
| 11,869,428 B2* | 1/2024 | Kawashima | H04N 5/70 |
| 2007/0241998 A1 | 10/2007 | Fish et al. | |
| 2008/0252223 A1 | 10/2008 | Toyoda et al. | |
| 2009/0079345 A1* | 3/2009 | Inuiya | H10K 59/65 |
| | | | 313/523 |
| 2009/0230872 A1 | 9/2009 | Kuroda | |
| 2015/0221706 A1 | 8/2015 | Udaka et al. | |
| 2020/0388790 A1 | 12/2020 | Yamazaki et al. | |
| 2021/0066669 A1 | 3/2021 | Kubota et al. | |
| 2021/0096678 A1 | 4/2021 | Kubota et al. | |
| 2021/0327979 A1 | 10/2021 | Kamada et al. | |
| 2022/0115446 A1 | 4/2022 | Kamada et al. | |
| 2023/0200670 A1* | 6/2023 | Kubota | B62D 1/04 |
| | | | 600/508 |
| 2023/0247873 A1* | 8/2023 | Kubota | G09F 9/30 |
| | | | 257/40 |
| 2023/0255094 A1* | 8/2023 | Kamada | G06V 40/1318 |
| | | | 257/40 |
| 2023/0309346 A1* | 9/2023 | Kubota | H10K 39/34 |

FOREIGN PATENT DOCUMENTS

| | | |
|---|---|---|
| JP | 2008-262176 A | 10/2008 |
| JP | 2014-197522 A | 10/2014 |
| KR | 2007-0004718 A | 1/2007 |
| TW | 200603672 | 1/2006 |
| TW | 201407843 | 2/2014 |
| WO | WO 2005/091262 A1 | 9/2005 |
| WO | WO 2006/134869 A1 | 12/2006 |
| WO | WO 2014/024582 A1 | 2/2014 |
| WO | WO 2020/148600 A1 | 7/2020 |
| WO | WO 2021/009621 A1 | 1/2021 |

OTHER PUBLICATIONS

Written Opinion (Application No. PCT/IB2020/059314) Dated Dec. 15, 2020.

* cited by examiner

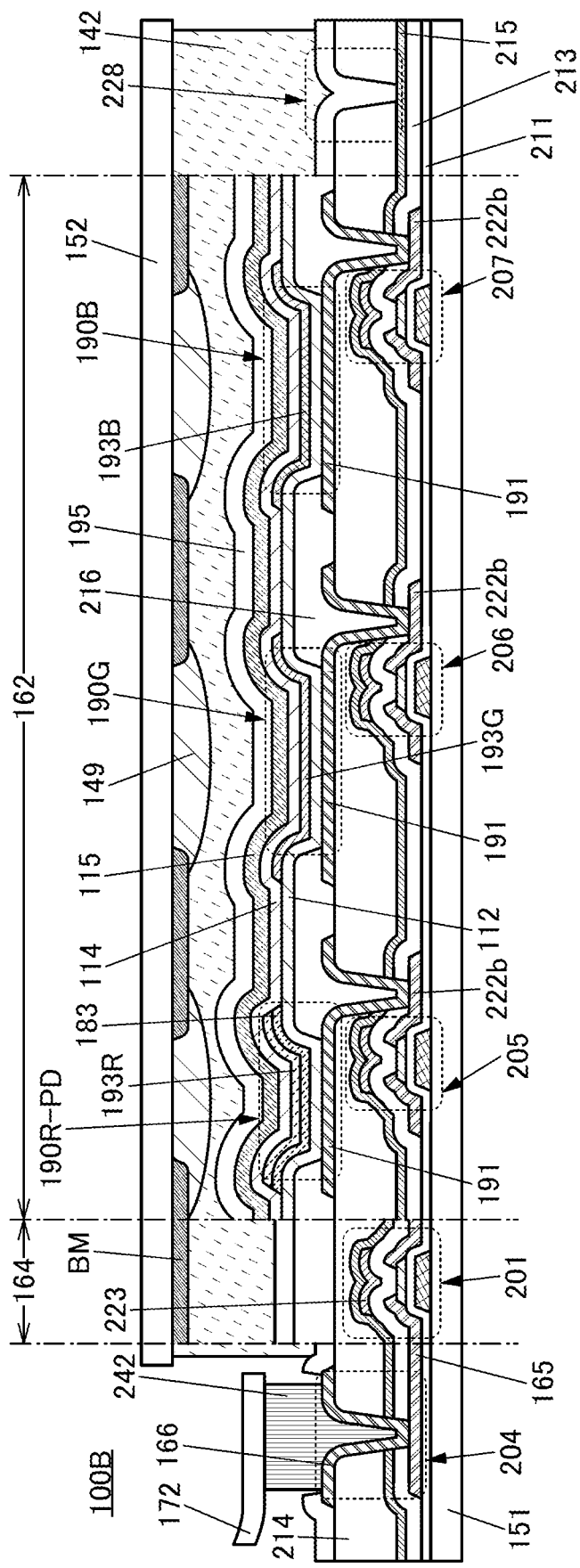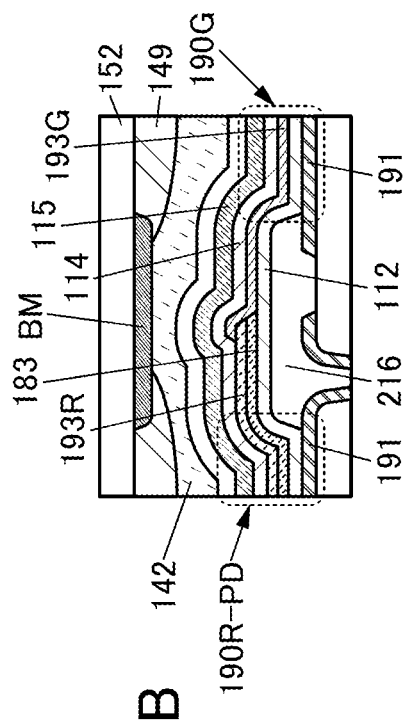
FIG. 8A
FIG. 8B

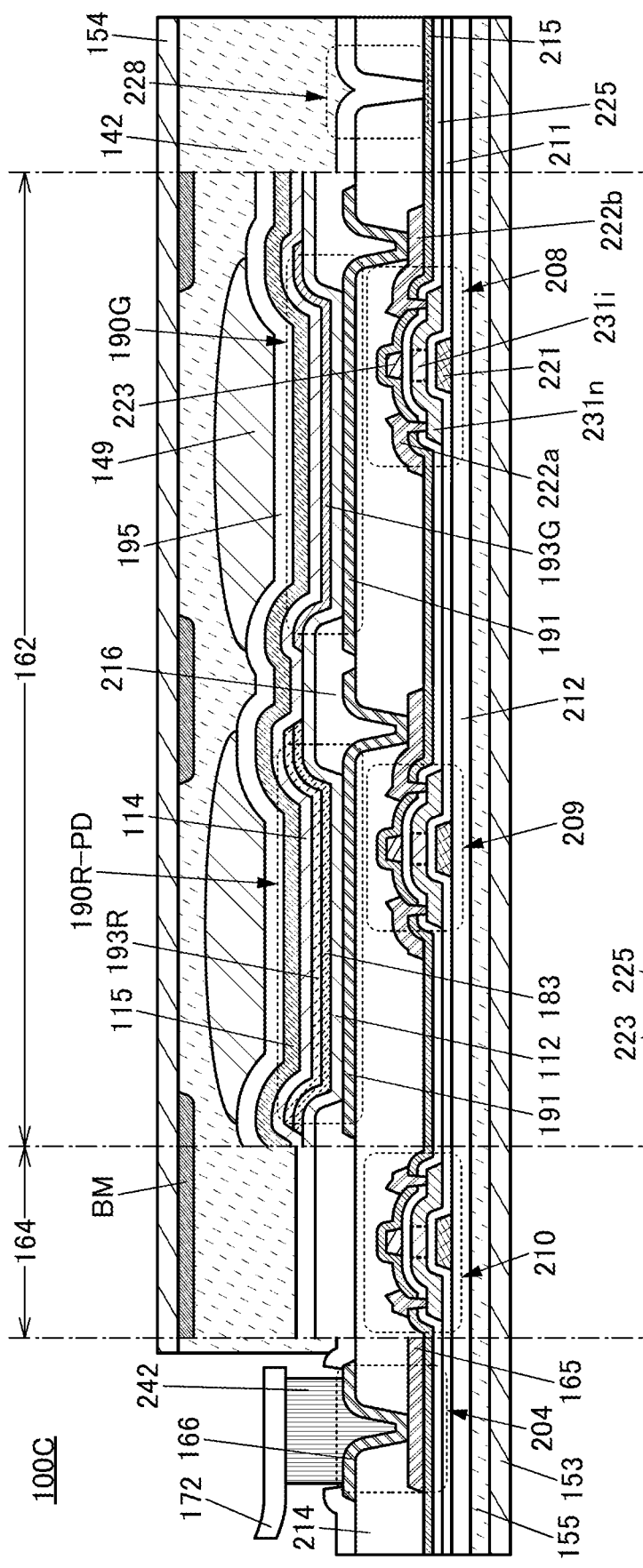

DISPLAY APPARATUS, DISPLAY MODULE, AND ELECTRONIC DEVICE

This application is a 371 of international application PCT/IB2020/059314 filed on Oct. 5, 2020 which is incorporated herein by reference.

TECHNICAL FIELD

One embodiment of the present invention relates to a display apparatus, a display module, and an electronic device. One embodiment of the present invention relates to a display apparatus including a light-emitting and light-receiving device (also referred to as a light-emitting and light-receiving element) and a light-emitting device (also referred to as a light-emitting element).

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

Recent display apparatuses have been expected to be applied to a variety of uses. Examples of uses for large-size display apparatuses include television devices for home use (also referred to as a TV or a television receiver), digital signage, and PIDs (Public Information Display). In addition, a smartphone and a tablet terminal including a touch panel are being developed as portable information terminals.

Light-emitting apparatuses including light-emitting devices have been developed as display apparatuses. Light-emitting devices (also referred to as EL devices or EL elements) utilizing electroluminescence (hereinafter referred to as EL) have features such as ease of reduction in thickness and weight, high-speed response to input signals, and driving with low DC voltage, and have been used in display apparatuses. For example, Patent Document 1 discloses a flexible light-emitting apparatus using an organic EL device (also referred to as organic EL element).

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display apparatus having a light detection function. An object of one embodiment of the present invention is to increase the resolution of a display apparatus having a light detection function. An object of one embodiment of the present invention is to provide a display apparatus having a photoelectric conversion function with high sensitivity. An object of one embodiment of the present invention is to provide a display apparatus with high light extraction efficiency. An object of one embodiment of the present invention is to provide a highly convenient display apparatus. An object of one embodiment of the present invention is to provide a multifunctional display apparatus. An object of one embodiment of the present invention is to provide a novel display apparatus.

Note that the description of these objects does not preclude the existence of other objects. One embodiment of the present invention does not need to achieve all the objects. Other objects can be derived from the description of the specification, the drawings, and the claims.

Means for Solving the Problems

A display apparatus of one embodiment of the present invention includes a light-emitting device, a light-emitting and light-receiving device, a first lens, and a second lens. The light-emitting device includes a first pixel electrode, a first light-emitting layer, and a common electrode. The light-emitting and light-receiving device includes a second pixel electrode, a second light-emitting layer, an active layer, and the common electrode. The active layer contains an organic compound. The first light-emitting layer is positioned between the first pixel electrode and the common electrode. The second light-emitting layer and the active layer are each positioned between the second pixel electrode and the common electrode. The light-emitting device has a function of emitting light of a first color. The light-emitting and light-receiving device has a function of emitting light of a second color and a function of receiving light of the first color and converting it into an electric signal. The light emitted by the light-emitting device is emitted to the outside of the display apparatus through the first lens. Light enters the light-emitting and light-receiving device from the outside of the display apparatus through the second lens.

The light-emitting and light-receiving device can have a structure in which the second pixel electrode, the active layer, the second light-emitting layer, and the common electrode are stacked in this order. Alternatively, the light-emitting and light-receiving device can have a structure in which the second pixel electrode, the second light-emitting layer, the active layer, and the common electrode are stacked in this order.

It is preferable that the light-emitting and light-receiving device further include a buffer layer. The buffer layer is preferably positioned between the second light-emitting layer and the active layer.

It is preferable that the light-emitting device and the light-emitting and light-receiving device further include a common layer. That the common layer is preferably positioned between the first pixel electrode and the common electrode and between the second pixel electrode and the common electrode.

It is preferable that the display apparatus further include an adhesive layer and a substrate. The adhesive layer is preferably positioned between the common electrode and the substrate. A refractive index of the adhesive layer is preferably smaller than a refractive index of the first lens.

It is preferable that the first lens be positioned between the substrate and the adhesive layer and have a convex surface on the adhesive layer side. Alternatively, it is preferable that the first lens be positioned between the common electrode and the adhesive layer and have a convex surface on the adhesive layer side.

One embodiment of the present invention is a module that includes the display apparatus having any of the above structures. For example, the module is a module provided with a connector such as a flexible printed circuit (hereinafter referred to FPC) or a TCP (tape carrier package) or a module mounted with an integrated circuit (IC) by a COG (Chip On Glass) method, a COF (Chip On Film) method, or the like.

One embodiment of the present invention is an electronic device including the above module and at least one of an antenna, a battery, a housing, a camera, a speaker, a microphone, and an operation button.

Effect of the Invention

One embodiment of the present invention can provide a display apparatus having a light detection function. One embodiment of the present invention can increase the resolution of a display apparatus having a light detection function. One embodiment of the present invention can provide a display apparatus having a photoelectric conversion function with high sensitivity. One embodiment of the present invention can provide a display apparatus with high light extraction efficiency. One embodiment of the present invention can provide a highly convenient display apparatus. One embodiment of the present invention can provide a multifunctional display apparatus. One embodiment of the present invention can provide a novel display apparatus.

Note that the description of these effects does not preclude the existence of other effects. One embodiment of the present invention does not need to have all these effects. Other effects can be derived from the description of the specification, the drawings, and the claims.

BRIEF DESCRIPTION OF THE DRAWINGS

FIG. 8A and FIG. 8B are cross-sectional views illustrating an example of a display apparatus.

FIG. 9A is a cross-sectional view illustrating an example of a display apparatus. FIG. 9B is a cross-sectional view illustrating an example of a transistor.

MODE FOR CARRYING OUT THE INVENTION

Figure 1A:
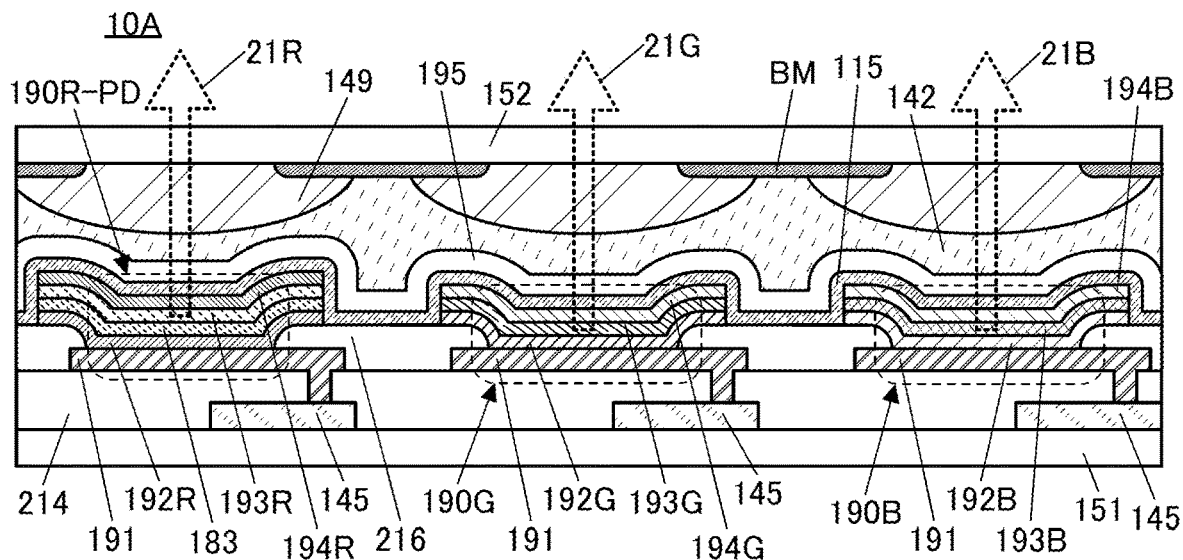
FIG. 1A and FIG. 1B are cross-sectional views illustrating an example of a display apparatus.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a display apparatus of one embodiment of the present invention will be described with reference to FIG. 1 to FIG. 9.

A display portion of the display apparatus of one embodiment of the present invention has a function of displaying an image using a light-emitting device. Furthermore, the display portion has one or both of an image-capturing function and a sensing function.

In the display apparatus of one embodiment of the present invention, a pixel includes a plurality of subpixels exhibiting different colors. A subpixel exhibiting any color includes a light-emitting and light-receiving device instead of a light-emitting device, and subpixels exhibiting the other colors each include a light-emitting device. The light-emitting and light-receiving device has both a function of emitting light (a light-emitting function) and a function of detecting light entering from the outside of the display apparatus and converting it into an electric signal (a light-receiving function). For example, in the case where a pixel includes three subpixels of a red subpixel, a green subpixel, and a blue subpixel, at least one of the subpixels (e.g., the red subpixel) includes a light-emitting and light-receiving device, and the other subpixels (e.g., the green subpixel and the blue subpixel) each include a light-emitting device. Thus, the display portion of the display apparatus of one embodiment of the present invention has a function of displaying an image using both a light-emitting and light-receiving device and a light-emitting device.

The light-emitting and light-receiving device functions as both a light-emitting device and a light-receiving device, whereby the pixel can have a light-receiving function without an increase in the number of subpixels included in the pixel. Thus, the display portion of the display apparatus can be provided with one or both of an image-capturing function and a sensing function while keeping the aperture ratio of the pixel (aperture ratio of each subpixel) and the resolution of the display apparatus. Accordingly, in the display apparatus of one embodiment of the present invention, the aperture ratio of the pixel can be more increased and the resolution can be increased more easily than in a display apparatus provided with a subpixel including a light-receiving device separately from a subpixel including a light-emitting device.

The light-emitting and light-receiving device can be manufactured by combining an organic EL device that is a light-emitting device and an organic photodiode that is a light-receiving device. For example, by adding an active layer of an organic photodiode to a layered structure of an organic EL device, the light-emitting and light-receiving device can be manufactured. Furthermore, in the light-emitting and light-receiving device manufactured by combining an organic EL device and an organic photodiode, concurrently depositing layers that can be shared with the organic EL device can inhibit an increase in the number of deposition steps.

For example, one of a pair of electrodes (a common electrode) can be a layer shared by the light-emitting and light-receiving device and the light-emitting device. In another example, at least one of a hole-injection layer, a hole-transport layer, an electron-transport layer, and an electron-injection layer is preferably a layer shared by the light-emitting and light-receiving device and the light-emitting device. In another example, the light-emitting and light-receiving device and the light-emitting device can have the same structure except for the presence or absence of an active layer of the light-receiving device. In other words, the light-emitting and light-receiving device can be manufactured by only adding the active layer of the light-receiving device to the light-emitting device. When the light-emitting and light-receiving device and the light-emitting device include a common layer in such a manner, the number of deposition steps and the number of masks can be reduced, thereby reducing the number of manufacturing steps and the manufacturing cost of the display apparatus. Furthermore, the display apparatus including the light-emitting and light-receiving device can be manufactured using an existing manufacturing apparatus and an existing manufacturing method for the display apparatus.

Note that a layer included in the light-emitting and light-receiving device might have a different function between the case where the light-emitting and light-receiving device functions as the light-receiving device and the case where the light-emitting and light-receiving device functions as the light-emitting device. In this specification, the name of a component is based on its function in the case where the light-emitting and light-receiving device functions as a light-emitting device. For example, a hole-injection layer functions as a hole-injection layer in the case where the light-emitting and light-receiving device functions as a light-emitting device, and functions as a hole-transport layer in the case where the light-emitting and light-receiving device functions as a light-receiving device. Similarly, an electron-injection layer functions as an electron-injection layer in the case where the light-emitting and light-receiving device functions as a light-emitting device, and functions as an electron-transport layer in the case where the light-emitting and light-receiving device functions as a light-receiving device. A layer included in the light-emitting and light-receiving device might have the same function in both the case where the light-emitting and light-receiving device functions as the light-receiving device and the case where the light-emitting and light-receiving device functions as the light-emitting device. The hole-transport layer functions as a hole-transport layer in the case where the light-emitting and light-receiving device functions as either a light-emitting device or a light-receiving device, and the electron-transport layer functions as an electron-transport layer in the case where the light-emitting and light-receiving device functions as either a light-emitting device or a light-receiving device.

As described above, the display portion of the display apparatus of this embodiment includes a light-emitting and light-receiving device and a light-emitting device. Specifically, light-emitting and light-receiving devices and light-emitting devices are arranged in a matrix in the display portion. Accordingly, the display portion has one or both of an image-capturing function and a sensing function in addition to a function of displaying an image.

The display portion can be used as an image sensor or a touch sensor. That is, by detecting light with the display portion, an image can be captured and the approach or touch of an object (e.g., a finger or a stylus) can be detected. Furthermore, in the display apparatus of this embodiment, the light-emitting devices can be used as a light source of the sensor. Accordingly, a light-receiving portion and a light source do not need to be provided separately from the display apparatus; hence, the number of components of an electronic device can be reduced.

In the display apparatus of this embodiment, when an object reflects light emitted by the light-emitting device included in the display portion, the light-emitting and light-receiving device can detect the reflected light; thus, imaging and touch (or approach) detection can be performed even in a dark place.

The display apparatus of this embodiment has a function of displaying an image using the light-emitting device and the light-emitting and light-receiving device. That is, the light-emitting device and the light-emitting and light-receiving device function as display devices (also referred to as display elements).

As the light-emitting device, an EL device such as an OLED (Organic Light Emitting Diode) and a QLED (Quantum-dot Light Emitting Diode) is preferably used. Examples of a light-emitting substance contained in the EL device include a substance emitting fluorescence (a fluorescent material), a substance emitting phosphorescence (a phosphorescent material), an inorganic compound (e.g., a quantum dot material), and a substance exhibiting thermally activated delayed fluorescence (a thermally activated delayed fluorescence (TADF) material). Alternatively, an LED such as a micro-LED (a light emitting diode) can be used as the light-emitting device.

The display apparatus of this embodiment has a function of detecting light using the light-emitting and light-receiving device. The light-emitting and light-receiving device can detect light having a shorter wavelength than light emitted by the light-emitting and light-receiving device itself.

When the light-emitting and light-receiving device is used as an image sensor, the display apparatus of this embodiment can capture an image using the light-emitting and light-receiving device. For example, the display apparatus of this embodiment can be used as a scanner.

For example, data on a fingerprint, a palm print, or the like can be obtained with the use of the image sensor. That is, a biological authentication sensor can be incorporated in the display apparatus of this embodiment. When the display apparatus incorporates a biological authentication sensor, the number of components of an electronic device can be reduced as compared to the case where a biological authentication sensor is provided separately from the display apparatus; thus, the size and weight of the electronic device can be reduced.

When the light-emitting and light-receiving device is used as a touch sensor, the display apparatus of this embodiment can detect the approach or touch of an object with the use of the light-emitting and light-receiving device.

The light-emitting and light-receiving device functions as a photoelectric conversion device that detects light entering the light-emitting and light-receiving device and generates charge. The amount of generated charge depends on the amount of incident light.

The light-emitting and light-receiving device can be manufactured by adding an active layer of a light-receiving device to the above-described structure of the light-emitting device.

A pn or pin photodiode structure can be applied to the light-emitting and light-receiving device, for example.

It is particularly preferable to use, for the light-emitting and light-receiving device, an active layer of an organic photodiode including a layer containing an organic compound. An organic photodiode, which is easily made thin, lightweight, and large in area and has a high degree of freedom for shape and design, can be used in a variety of display apparatuses.

One embodiment of the present invention is a display apparatus including a light-emitting device, a light-emitting and light-receiving device, a first lens, and a second lens. The light-emitting device includes a first pixel electrode, a first light-emitting layer, and a common electrode. The light-emitting and light-receiving device includes a second pixel electrode, a second light-emitting layer, an active layer, and the common electrode. The active layer contains an organic compound. The first light-emitting layer is positioned between the first pixel electrode and the common electrode. The second light-emitting layer and the active layer are each positioned between the second pixel electrode and the common electrode. The light-emitting device has a function of emitting light of a first color. The light-emitting and light-receiving device has a function of emitting light of a second color and functions of receiving light of the first color and converting it into an electric signal. The light emitted by the light-emitting device is emitted to the outside through the first lens. Light enters the light-emitting and light-receiving device from the outside of the display apparatus through the second lens.

When light enters the light-emitting and light-receiving device through the lens, a range of the light entering the light-emitting and light-receiving device can be reduced. Thus, overlap of image-capturing ranges between a plurality of light-emitting and light-receiving devices can be inhibited, whereby a clear image with little blurring can be captured. Note that the overlap of image-capturing ranges between a plurality of light-emitting and light-receiving devices can also be referred to as receiving reflected light from the same position by the plurality of light-emitting and light-receiving devices, or capturing images at the same position by the plurality of light-emitting and light-receiving devices. In addition, the lens can condense the incident light. Accordingly, the amount of light entering the light-emitting and light-receiving device can be increased. Thus, the photoelectric conversion efficiency, i.e., the sensitivity, of the light-emitting and light-receiving device can be increased.

When the light emitted by the light-emitting and light-receiving device is emitted to the outside of the display apparatus through the lens, it is preferable that the light emitted by the light-emitting device be also emitted to the outside of the display apparatus through the lens. The lens can condense the light emitted from each of the light-emitting and light-receiving device and the light-emitting device. Accordingly, the amount of light emitted to the outside of the display apparatus can be increased. This can increase the light extraction efficiency of the display apparatus.

More detailed structures of the display apparatus of one embodiment of the present invention will be described below with reference to FIG. 1 and FIG. 2.

The display apparatus of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

FIG. 1 and FIG. 2 illustrate top-emission display apparatuses as examples.

[Display Apparatus 10A]

Figure 1B:
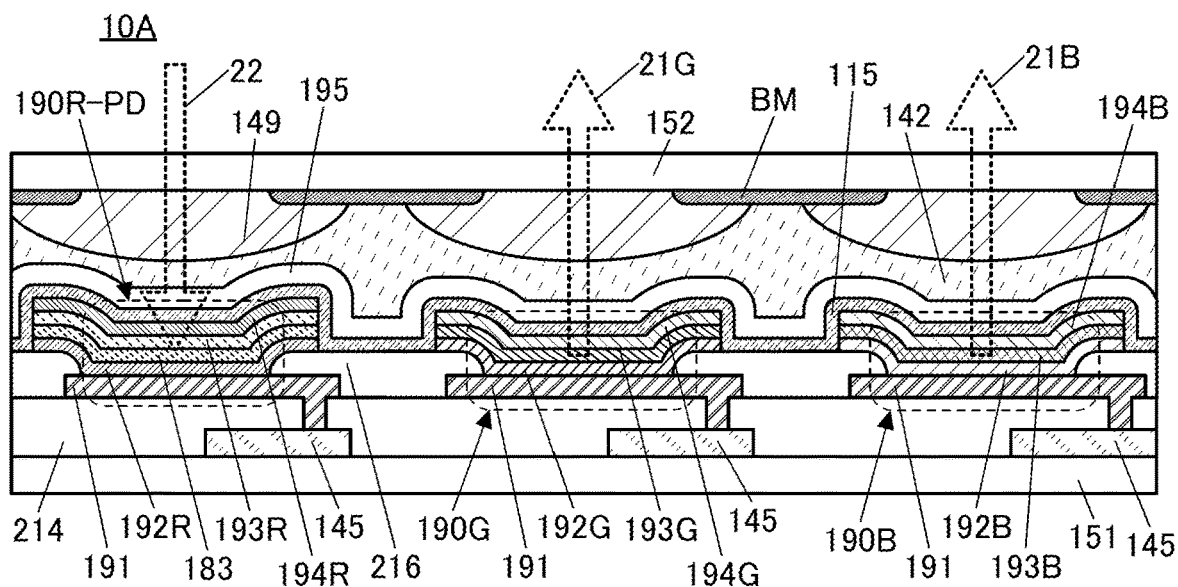

FIG. 1A and FIG. 1B illustrate cross-sectional views of a display apparatus 10A.

The display apparatus 10A includes a substrate 151, a substrate 152, a lens 149, an adhesive layer 142, a light-emitting device 190B, a light-emitting device 190G, and a light-emitting and light-receiving device 190R-PD.

The light-emitting device 190B has a function of emitting blue light 21B. The blue light 21B is extracted to the outside of the display apparatus 10A thought the lens 149 and the adhesive layer 142.

The light-emitting device 190G has a function of emitting green light 21G. The green light 21G is extracted to the outside of the display apparatus 10A thought the lens 149 and the adhesive layer 142.

The light-emitting and light-receiving device 190R-PD has both a function as a light-emitting device and a function as a light-receiving device.

FIG. 1A illustrates a case where the light-emitting and light-receiving device 190R-PD functions as a light-emitting device. The light-emitting and light-receiving device 190R-PD has a function of emitting red light 21R. The red light 21R is extracted to the outside of the display apparatus 10A through the lens 149 and the adhesive layer 142.

FIG. 1B illustrates a case where the light-emitting and light-receiving device 190R-PD functions as a light-receiving device. FIG. 1B illustrates an example in which the light-emitting and light-receiving device 190R-PD detects light 22 that is the blue light 21B and the green light 21G emitted by the light-emitting device 190B and the light-emitting device 190G, respectively, and then reflected (or scattered) by an object. The light 22 enters the light-emitting and light-receiving device 190R-PD through the lens 149 and the adhesive layer 142.

When light enters the light-emitting and light-receiving device 190R-PD through the lens 149, a range of the light entering the light-emitting and light-receiving device 190R-PD can be reduced. Thus, overlap of image-capturing ranges between a plurality of the light-emitting and light-receiving devices 190R-PD can be inhibited, whereby a clear image with little blurring can be captured.

In addition, the lens 149 can condense the incident light. Accordingly, the amount of light entering the light-emitting and light-receiving device 190R-PD can be increased. Thus, the light-receiving sensitivity of the light-emitting and light-receiving device 190R-PD can be increased.

When the light emitted by the light-emitting and light-receiving device 190R-PD is emitted to the outside of the display apparatus 10A through the lens 149, it is preferable that the light emitted by the light-emitting device 190B and the light emitted by the light-emitting device 190G be also emitted to the outside of the display apparatus 10A through the lens 149. The lens 149 can condense the light emitted from each of the light-emitting and light-receiving device 190R-PD, the light-emitting device 190G, and the light-emitting device 190B. Accordingly, the amount of light emitted to the outside of the display apparatus 10A can be increased. This can increase the light extraction efficiency of the display apparatus 10A.

Figures 1C, 1D, 1E:
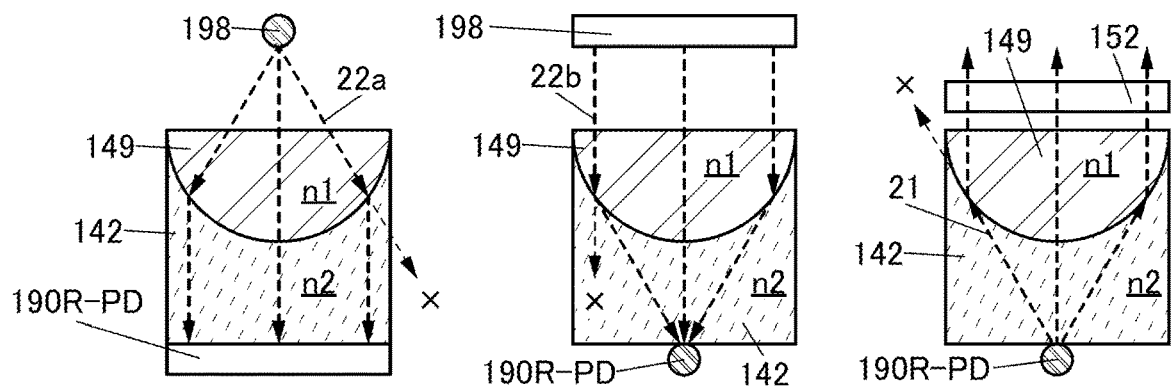
FIG. 1C to FIG. 1E are cross-sectional views illustrating examples of a path of light in a display apparatus.

How light, which enters the light-emitting and light-receiving device 190R-PD through the lens 149 and the adhesive layer 142, proceeds will be described with reference to FIG. 1C and FIG. 1D. Note that for simple explanation, light refraction only at an interface between the lens 149 and the adhesive layer 142 is considered here. FIG. 1C is a diagram in which an object 198 is regarded as a focal point, and FIG. 1D is a diagram in which the light-emitting and light-receiving device 190R-PD is regarded as a focal point.

A refractive index n1 of the lens 149 is preferably greater than a refractive index n2 of the adhesive layer 142.

As illustrated in a thin dashed line in FIG. 1C, in the case where the lens 149 is not provided, light 22a, which is reflected by the object 198 and in the oblique direction with respect to the light-receiving surface of the light-emitting and light-receiving device 190R-PD, might not enter the light-emitting and light-receiving device 190R-PD but enter other light-emitting and light-receiving device depending on the resolution of the display apparatus. In that case, image-capturing ranges overlap between a plurality of light-emitting and light-receiving devices, whereby a captured image is blurred. Meanwhile, as illustrated in thick dashed lines in FIG. 1C, when the lens 149 is provided, the light 22a is refracted at the interface between the lens 149 and the adhesive layer 142 and enters the light-emitting and light-receiving device 190R-PD.

As illustrated in a thin dashed line in FIG. 1D, in the case where the lens 149 is not provided, light 22b, which is reflected by the object 198 and perpendicular to the light-receiving surface of the light-emitting and light-receiving device 190R-PD, does not enter the light-emitting and light-receiving device 190R-PD. Meanwhile, as illustrated in thick dashed lines in FIG. 1D, when the lens 149 is provided, the light 22b is refracted at the interface between the lens 149 and the adhesive layer 142 and enters the light-emitting and light-receiving device 190R-PD.

As illustrated in FIG. 1C and FIG. 1D, more light reflected by the object 198 can enter the light-emitting and light-receiving device 190R-PD by providing the lens 149. This can increase the photoelectric conversion efficiency and improve the imaging quality and the sensing accuracy.

How light, which is emitted by the light-emitting and light-receiving device 190R-PD, proceeds will be described with reference to FIG. 1E. Note that for simple explanation, light refraction only at the interface between the lens 149 and the adhesive layer 142 is considered here. FIG. 1E is a diagram in which the light-emitting and light-receiving device 190R-PD is regarded as a focal point.

As illustrated in a thin dashed line in FIG. 1E, in the case where the lens 149 is not provided, the light 21, which is emitted by the light-emitting and light-receiving device 190R-PD and in the oblique direction with respect to the substrate 152, is emitted in the oblique direction with respect to the substrate 152. Meanwhile, as illustrated in thick dashed lines in FIG. 1E, when the lens 149 is provided, the light 21 is refracted at the interface between the lens 149 and the adhesive layer 142 and emitted in the perpendicular direction with respect to the substrate 152. That is, in the case where the lens 149 is provided, components of light emitted in the perpendicular direction with respect to the substrate 152 among light emitted by the light-emitting and light-receiving device 190R-PD are larger than that of the case where the lens 149 is not provided. Therefore, the amount of light that can be extracted to the outside of the display apparatus is increased depending on the presence of the lens 149; thus, the lens 149 is preferably provided.

As a method for forming the lens used in the display apparatus of this embodiment, a lens such as a microlens may be formed directly over the substrate, or over the light-emitting device and over the light-emitting and light-receiving device, or a lens array formed separately, such as a microlens array, may be bonded to the substrate. Note that there is no particular limitation on the cross-sectional shape of the lens, a hemispherical lens having a convex surface, a hemispherical lens having a concave surface, a lens having two convex surfaces, a lens having two concave surfaces, or the like can be used. In particular, the hemispherical lens having a convex surface is preferably used as the lens.

As described above, the refractive index of the lens is preferably greater than the refractive index of the adhesive layer. Specifically, the lens preferably has a refractive index greater than or equal to 1.3 and less than or equal to 2.5. The lens can be formed using at least one of an inorganic material and an organic material. For example, a material containing a resin can be used for the lens. Moreover, a material containing at least one of an oxide and a sulfide can be used for the lens.

Specifically, a resin containing chlorine, bromine, or iodine, a resin containing a heavy metal atom, a resin having an aromatic ring, a resin containing sulfur, and the like can be used for the lens. Alternatively, a material containing a resin and nanoparticles of a material having a higher refractive index than the resin can be used for the lens. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens. Alternatively, zinc sulfide and the like can be used for the lens.

As the adhesive layer 142, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

Note that without limitation to a solid sealing structure, the display apparatus may have a hollow sealing structure. For example, a space between the substrate 151 and the substrate 152 may be filled with an inert gas (e.g., nitrogen or argon).

The display apparatus 10A includes the light-emitting and light-receiving device 190R-PD, the light-emitting device 190G, the light-emitting device 190B, a transistor 145, and the like between a pair of substrates (the substrate 151 and the substrate 152).

The light-emitting and light-receiving device 190R-PD has a function of detecting light. Specifically, the light-emitting and light-receiving device 190R-PD is a photoelectric conversion device that receives the light 22 entering from the outside of the display apparatus 10A and converts it into an electric signal. The light 22 can also be referred to as light that is emitted by one or both of the light-emitting device 190G and the light-emitting device 190B and reflected (or scattered) by an object.

The light-emitting device 190 has a function of emitting visible light. Specifically, the light-emitting device 190 is an electroluminescent device that emits light toward the substrate 152 (see the light 21G and the light 21B) when voltage is applied between a pixel electrode 191 and a common electrode 115.

The light-emitting device 190B includes the pixel electrode 191, a buffer layer 192B, a light-emitting layer 193B, a buffer layer 194B, and the common electrode 115.

The light-emitting device 190G includes the pixel electrode 191, a buffer layer 192G, a light-emitting layer 193G, a buffer layer 194G, and the common electrode 115.

The light-emitting and light-receiving device 190R-PD includes the pixel electrode 191, a buffer layer 192R, an active layer 183, a light-emitting layer 193R, a buffer layer 194R, and the common electrode 115.

The pixel electrode 191, the buffer layer 192B, the buffer layer 192G, the buffer layer 192R, the light-emitting layer 193B, the light-emitting layer 193G, the light-emitting layer 193R, the active layer 183, the buffer layer 194B, the buffer layer 194G, the buffer layer 194R, and the common electrode 115 may each have a single-layer structure or a stacked-layer structure.

The buffer layer 192, the light-emitting layer 193, and the buffer layer 194 can also be referred to an organic layer (a layer containing an organic compound) or an EL layer. The pixel electrode 191 preferably has a function of reflecting visible light. The common electrode 115 has a function of transmitting visible light.

In the display apparatus 10A, the buffer layer 192, the light-emitting layer 193, and the buffer layer 194 are separately formed for the devices.

The light-emitting device includes at least the light-emitting layer 193 between a pair of electrodes. The light-emitting and light-receiving device includes at least the active layer 183 and the light-emitting layer 193 between a pair of electrodes.

The light-emitting device and the light-emitting and light-receiving device may each further include a layer containing a substance with a high hole-injection property, a substance with a high hole-transport property, a substance with a high hole-blocking property, a substance with a high electron-transport property, a substance with a high electron-injection property, a substance with a high electron-blocking property, a substance with a bipolar property (a substance with a high electron- and hole-transport property), or the like.

The buffer layers 192R, 192G, and 192B can each include one or both of a hole-injection layer and a hole-transport layer. Furthermore, the buffer layers 192R, 192G, and 192B may each include an electron-blocking layer. The buffer layers 194B, 194G, and 194R can each include one or both of an electron-injection layer and an electron-transport layer. Furthermore, the buffer layers 194R, 194G, and 194B may each include a hole-blocking layer.

The pixel electrode 191 is positioned over an insulating layer 214. An end portion of the pixel electrode 191 is covered with a partition 216. Two adjacent pixel electrodes 191 are electrically insulated (electrically isolated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 may be either a layer transmitting visible light or a layer blocking visible light. For example, with the use of a resin material containing a pigment or dye, or brown resist material, a partition that blocks visible light can be formed.

The pixel electrode 191 is electrically connected to a source or a drain of the transistor 145 through an opening provided in the insulating layer 214. The transistor 145 has a function of controlling the driving of the light-emitting device or the light-emitting and light-receiving device.

At least part of a circuit electrically connected to the light-emitting and light-receiving device 190R-PD is preferably formed using the same material in the same steps as a circuit electrically connected to the light-emitting device 190 of each color. In that case, the thickness of the display apparatus can be reduced compared with the case where the two circuits are separately formed, resulting in simplification of the manufacturing steps.

The light-emitting and light-receiving device 190R-PD and the light-emitting device 190 of each color are preferably covered with a protective layer 195. In FIG. 1A and the like, the protective layer 195 is provided on and in contact with the common electrode 115. Providing the protective layer 195 can inhibit entry of impurities such as the light-emitting and light-receiving device 190R-PD and the light-emitting device of each color, so that the light-emitting and light-receiving device 190R-PD and the light-emitting device of each color can be increased. The protective layer 195 and the substrate 152 are bonded to each other with the adhesive layer 142.

A light-blocking layer BM is provided on a surface of the substrate 152 on the substrate 151 side. The light-blocking layer BM has an opening at the position overlapping with the light-emitting device 190 of each color and an opening at the position overlapping with the light-emitting and light-receiving device 190R-PD. Note that in this specification and the like, the position overlapping with the light-emitting device 190 refers specifically to a position overlapping with a light-emitting region of the light-emitting device 190. Similarly, the position overlapping with the light-emitting and light-receiving device 190R-PD refers specifically to a position overlapping with a light-emitting region and a light-receiving region of the light-emitting and light-receiving device 190R-PD.

As illustrated in FIG. 1B, the light-emitting and light-receiving device 190R-PD can detect light that is emitted by the light-emitting device 190 and reflected by the object. However, in some cases, light emitted by the light-emitting device 190 is reflected inside the display apparatus 10A and enters the light-emitting and light-receiving device 190R-PD without via an object. The light-blocking layer BM can reduce the influence of such stray light. Thus, noise can be reduced, and the sensitivity of a sensor using the light-emitting and light-receiving device 190R-PD can be increased.

For the light-blocking layer BM, a material that blocks light emitted by the light-emitting device can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of at least two layers of a red color filter, a green color filter, and a blue color filter.

[Display Apparatus 10B]

Figure 2A:
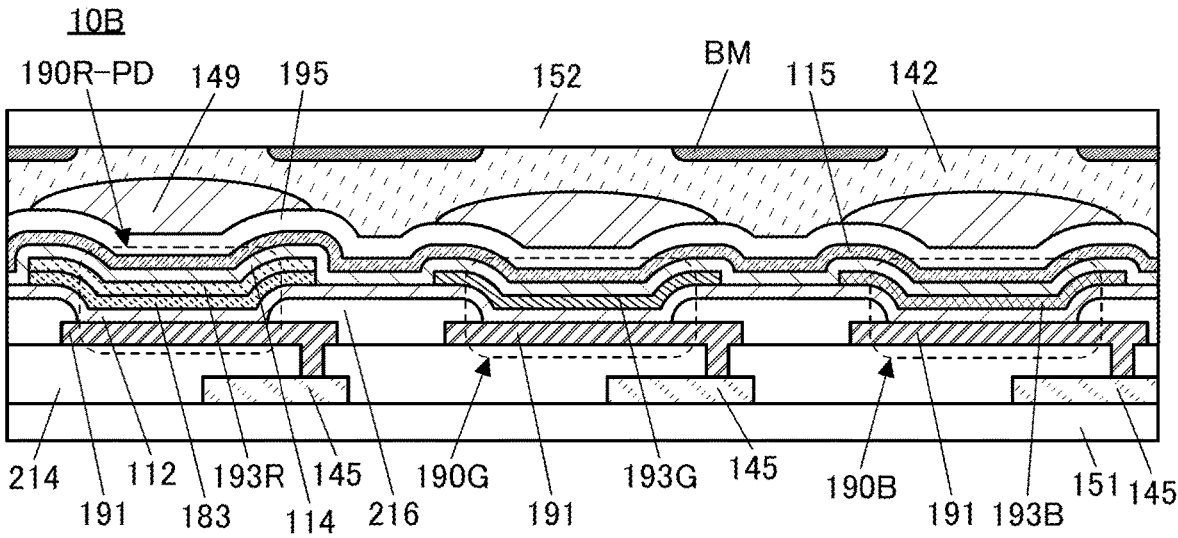
FIG. 2A and FIG. 2B are cross-sectional views illustrating examples of a display apparatus.

A display apparatus 10B illustrated in FIG. 2A is different from the display apparatus 10A in that each of the light-emitting device 190 and the light-emitting and light-receiving device 190R-PD does not include the buffer layer 192 and the buffer layer 194 and includes a common layer 112 and a common layer 114, and includes the lens 149 on and in contact with the protective layer 195. Note that in the description of the display apparatus below, components similar to those of the above-mentioned display apparatus are not described in some cases.

Note that the stacked-layer structure of the light-emitting device 190B, the light-emitting device 190G, and the light-emitting and light-receiving device 190R-PD is not limited to the structures of the display apparatuses 10A and 10B. In the light-emitting device and the light-emitting and light-receiving device, each layer may be provided independently. It is preferable that the light-emitting device and the light-emitting and light-receiving device include at least one common layer. More detailed structures of the light-emitting and light-receiving device will be described later (FIG. 5A to FIG. 5F).

The display apparatus 10A (FIG. 1A and FIG. 1B) illustrates an example in which the lens 149 is positioned between the substrate 152 and the adhesive layer 142, and the convex surface is positioned on the substrate 151 side. By contrast, the display apparatus 10B illustrated in FIG. 2A illustrates an example in which the lens 149 is positioned between the protective layer 195 and the adhesive layer 142, and the convex surface is positioned on the substrate 152 side. In this manner, the position and the orientation of the lens 149 can be determined as appropriate.

[Display Apparatus 10C]

Figure 2B:
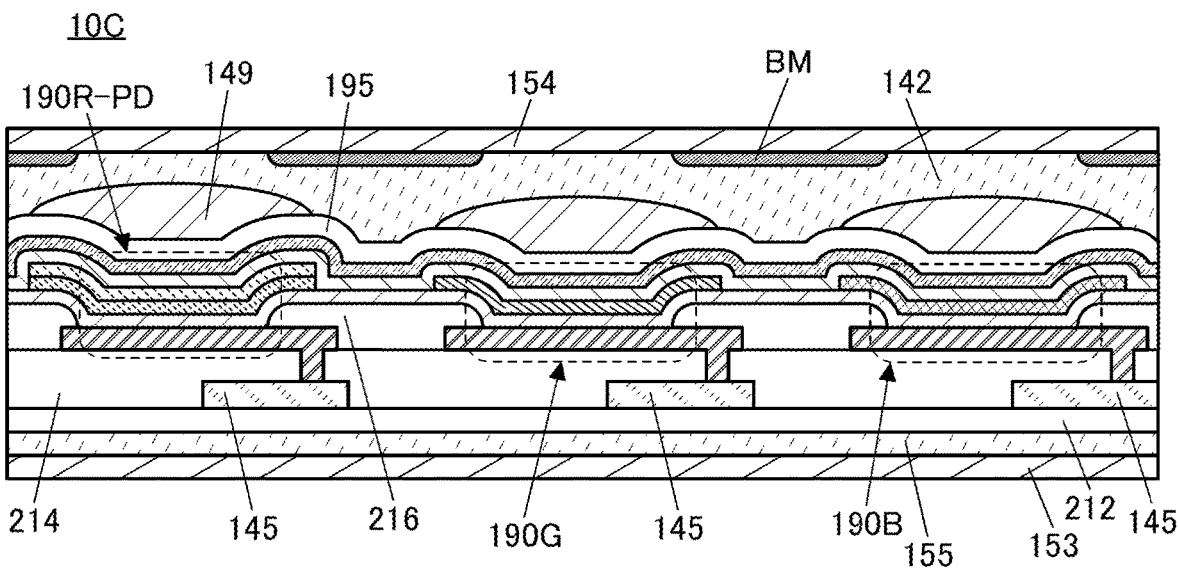

A display apparatus 10C illustrated in FIG. 2B is different from the display apparatus 10B in that the substrate 151 and the substrate 152 are not included but a substrate 153, a substrate 154, an adhesive layer 155, and an insulating layer 212 are included.

The substrate 153 and the insulating layer 212 are bonded to each other with the adhesive layer 155. The substrate 154 and the protective layer 195 are bonded to each other with the adhesive layer 142.

The display apparatus 10C is formed in such a manner that the insulating layer 212, the transistor 145, the light-emitting and light-receiving device 190R-PD, the light-emitting device 190, and the like that are formed over a formation substrate are transferred onto the substrate 153. The substrate 153 and the substrate 154 preferably have flexibility. Accordingly, the flexibility of the display apparatus 10C can be increased. For example, a resin is preferably used for each of the substrate 153 and the substrate 154.

For each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 153 and the substrate 154.

As the substrate included in the display apparatus of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic film.

Figure 2C:
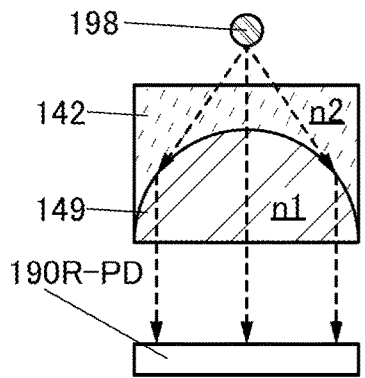
FIG. 2C to FIG. 2E are cross-sectional views illustrating examples of a path of light in a display apparatus.

How light, which enters the light-emitting and light-receiving device 190R-PD, proceeds in the display apparatus 10B and the display apparatus 10C will be described with reference to FIG. 2C and FIG. 2D. Note that for simple explanation, light refraction only at the interface between the lens 149 and the adhesive layer 142 is considered here. FIG. 2C is a diagram in which the object 198 is regarded as a focal point, and FIG. 2D is a diagram in which the light-emitting and light-receiving device 190R-PD is regarded as a focal point.

The refractive index n1 of the lens 149 is preferably greater than the refractive index n2 of the adhesive layer 142.

As illustrated in FIG. 2C, light, which is reflected by the object 198 and in the oblique direction with respect to the light-receiving surface of the light-emitting and light-receiving device 190R-PD, is refracted at the interface between the lens 149 and the adhesive layer 142 and then enters the light-emitting and light-receiving device 190R-PD.

Figure 2D:
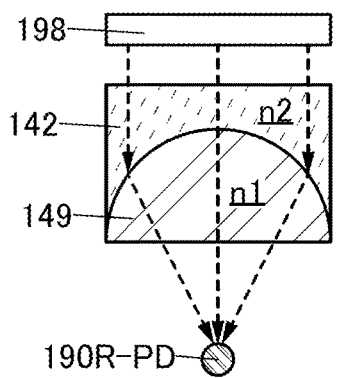

As illustrated in FIG. 2D, light, which is reflected by the object 198 and in the perpendicular direction with respect to the light-receiving surface of the light-emitting and light-receiving device 190R-PD, is refracted at the interface between the lens 149 and the adhesive layer 142 and then enters the light-emitting and light-receiving device 190R-PD.

As illustrated in FIG. 2C and FIG. 2D, more light reflected by the object 198 can enter the light-emitting and light-receiving device 190R-PD by providing the lens 149. This can increase the photoelectric conversion efficiency and improve the imaging quality and the sensing accuracy of the light-emitting and light-receiving device 190R-PD.

Figure 2E:
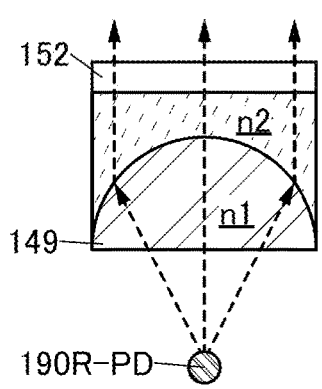

How light, which is emitted by the light-emitting and light-receiving device 190R-PD, proceeds in the display apparatus 10B and the display apparatus 10C will be described with reference to FIG. 2E. Note that for simple explanation, light refraction only at the interface between the lens 149 and the adhesive layer 142 is considered here. FIG. 2E is a diagram in which the light-emitting and light-receiving device 190R-PD is regarded as a focal point.

As illustrated in FIG. 2E, light, which is emitted by the light-emitting and light-receiving device 190R-PD and in the oblique direction with respect to the substrate 152, is refracted at the interface between the lens 149 and the adhesive layer 142, and then is emitted in the perpendicular direction with respect to the substrate 152. The lens 149 is preferably provided not only in a subpixel including the light-emitting and light-receiving device 190R-PD, but also in a subpixel including the light-emitting device 190G or the light-emitting device 190B. This can increase the extraction efficiency for light emission of each color.

[Function of Display Apparatus]

FIG. 3A to FIG. 3C and FIG. 3E are cross-sectional views of display apparatus of one embodiment of the present invention.

Figure 3A:
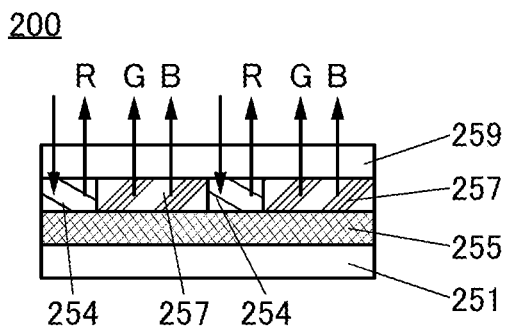
FIG. 3A to FIG. 3C and FIG. 3E are cross-sectional views illustrating examples of a display apparatus.

A display apparatus 200 illustrated in FIG. 3A includes a layer 254 including light-emitting and light-receiving devices, a functional layer 255, and a layer 257 including light-emitting devices, between a substrate 251 and a substrate 259.

In the display apparatus 200, green (G) light and blue (B) light are emitted from the layer 257 including light-emitting devices, and red (R) light is emitted from the layer 254 including light-emitting and light-receiving devices. In the display apparatus of one embodiment of the present invention, the color of light emitted by the layer 254 including light-emitting and light-receiving devices is not limited to red. Furthermore, the color of light emitted by the layer 257 including light-emitting devices is not limited to the combination of green and blue.

The light-emitting and light-receiving device included in the layer 254 including light-emitting and light-receiving devices can detect light that enters from the outside of the display apparatus 200. The light-emitting and light-receiving device can detect one or both of green light and blue light, for example.

The functional layer 255 includes a circuit for driving a light-emitting and light-receiving device and a circuit for driving a light-emitting device. A switch, a transistor, a capacitor, a resistor, a wiring, a terminal, and the like can be provided in the functional layer 255. Note that in the case where the light-emitting device and the light-emitting and light-receiving device are driven by a passive-matrix method, a structure not provided with a switch or a transistor may be employed.

Figure 3B:
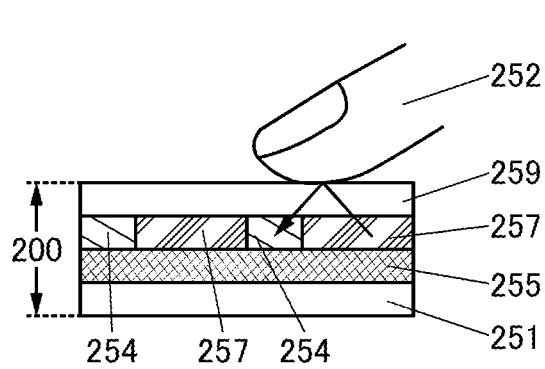

The display apparatus of one embodiment of the present invention may have a function of detecting an object such as a finger that is touching the display apparatus (a function of a touch panel). For example, after light emitted by the light-emitting device in the layer 257 including light-emitting devices is reflected by a finger that touches the display apparatus 200 as illustrated in FIG. 3B, the light-emitting and light-receiving device in the layer 254 including light-emitting and light-receiving devices can detect the reflected light. Although a case where light emitted by the light-emitting device is reflected by an object is described below as an example, light might be scattered by an object.

Figure 3C:
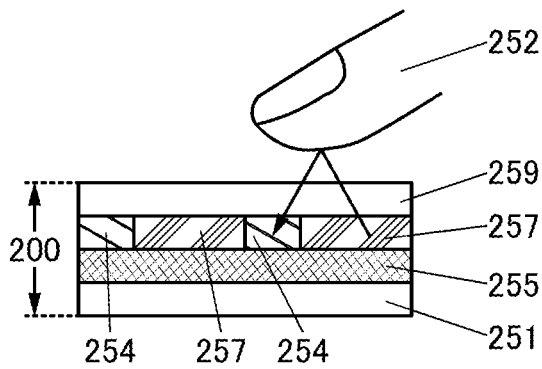

The display apparatus of one embodiment of the present invention may have a function of detecting an object that is close to (but is not touching) the display apparatus as illustrated in FIG. 3C or capturing an image of such an object.

Figures 3D, 3E:
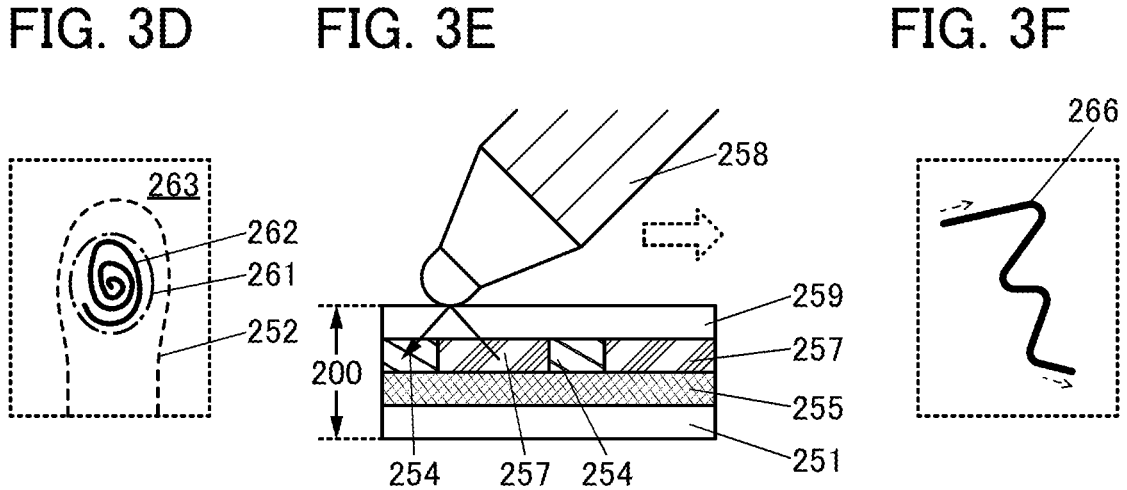
FIG. 3D and FIG. 3F are diagrams illustrating examples of an image captured by the display apparatus.

The display apparatus of one embodiment of the present invention may have a function of detecting a fingerprint of a finger 252. FIG. 3D illustrates a diagram of an image captured by the display apparatus of one embodiment of the present invention. In an image-capturing range 263 in FIG. 3D, the outline of the finger 252 is indicated by a dashed line and the outline of a contact portion 261 is indicated by a dashed-dotted line. In the contact portion 261, a high-contrast image of a fingerprint 262 can be captured owing to a difference in the amount of light entering the light-emitting and light-receiving device.

The display apparatus of one embodiment of the present invention can also function as a pen tablet. FIG. 3E illustrates a state in which a tip of a stylus 258 slides in a direction indicated by a dashed arrow while the tip of the stylus 258 touches the substrate 259.

As illustrated in FIG. 3E, when the scattered light scattered by the contact surface between the tip of the stylus 258 and the substrate 259 enters the layer 254 including light-emitting and light-receiving devices that overlap with the contact surface, the position of the tip of the stylus 258 can be detected with high accuracy.

Figure 3F:
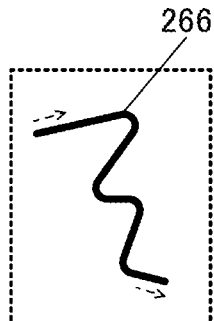

FIG. 3F illustrates an example of a path 266 of the stylus 258 that is detected by the display apparatus of one embodiment of the present invention. The display apparatus of one embodiment of the present invention can detect the position of an object, such as the stylus 258, with high position accuracy, so that high-definition drawing can be performed using a drawing application or the like. Unlike the case of using a capacitive touch sensor, an electromagnetic induction touch pen, or the like, the display apparatus can detect even the position of a highly insulating object, the material of a tip portion of the stylus 258 is not limited, and a variety of writing materials (e.g., a brush, a glass pen, a quill pen, and the like) can be used.

[Pixel]

The display apparatus of one embodiment of the present invention includes a plurality of pixels arranged in a matrix. One pixel includes a plurality of subpixels. One subpixel includes one light-emitting device or one light-emitting and light-receiving device.

The plurality of pixels each include one or both of a subpixel including a light-emitting device and a subpixel including a light-emitting and light-receiving device.

For example, the pixel includes a plurality of subpixels each including a light-emitting device and one subpixel including a light-emitting and light-receiving device.

The display apparatus including the light-emitting and light-receiving device has no need to change the pixel arrangement when incorporating a light-receiving function into pixels; thus, a display portion can be provided with one or both of an image-capturing function and a sensing function without reductions in aperture ratio and resolution.

Note that the light-emitting and light-receiving device may be provided in all the pixels or in some of the pixels. In addition, one pixel may include a plurality of light-emitting and light-receiving devices.

In the case where the pixel includes three subpixels each including a light-emitting device, as the three subpixels, subpixels of three colors of RGB, subpixels of three colors of yellow (Y), cyan (C), and magenta (M), and the like can be given. In the case where the pixel includes four subpixels each including a light-emitting device, as the four subpixels, subpixels of four colors of R, G, B, and white (W), subpixels of four colors of R, G, B, and Y, and the like can be given.

FIG. 4A to FIG. 4D illustrate examples of a pixel which includes a plurality of subpixels each including a light-emitting device and includes one subpixel including a light-emitting and light-receiving device. Note that the arrangement of subpixels is not limited to the illustrated order. For example, the positions of a subpixel (B) and a subpixel (G) may be reversed.

Figure 4A:
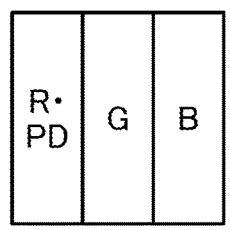
FIG. 4A to FIG. 4G are top views illustrating examples of pixels.

A pixel illustrated in FIG. 4A employs stripe arrangement and includes a subpixel (R·PD) that exhibits red light and has a light-receiving function, a subpixel (G) that exhibits green light, and a subpixel (B) that exhibits blue light. In a display apparatus including a pixel composed of three subpixels of R, G, and B, a light-emitting device used in the R subpixel can be replaced with a light-emitting and light-receiving device, so that the display apparatus can have a light-receiving function in the pixel.

Figure 4B:
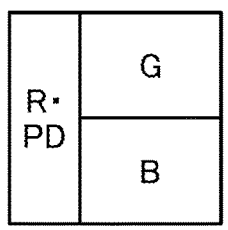

A pixel illustrated in FIG. 4B includes a subpixel (R·PD) that exhibits red light and has a light-receiving function, a subpixel (G) that exhibits green light, and a subpixel (B) that exhibits blue light. The subpixel (R·PD) is provided in a column different from a column where the subpixel (G) and the subpixel (B) are positioned. The subpixel (G) and the subpixel (B) are alternately arranged in the same column; one is provided in an odd-numbered row and the other is provided in an even-numbered row. The color of the subpixel positioned in a column different from the column where the subpixels of the other colors are positioned is not limited to red and may be green or blue.

Figure 4E:
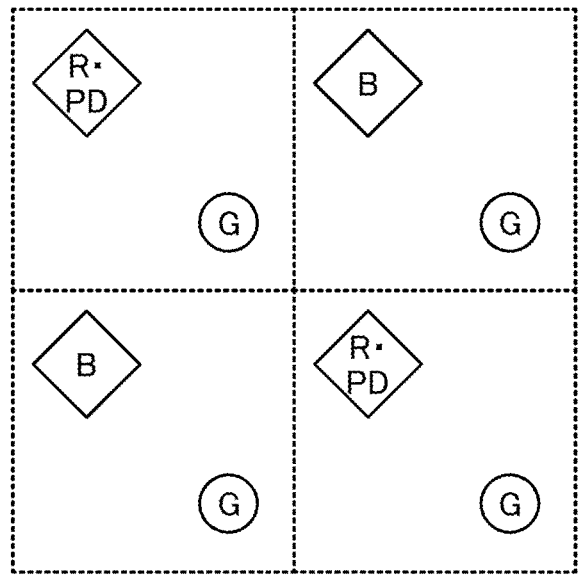
Figure 4C:
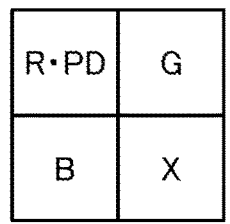

A pixel illustrated in FIG. 4C employs matrix arrangement and includes a subpixel (R·PD) that exhibits red light and has a light-receiving function, a subpixel (G) that exhibits green light, a subpixel (B) that exhibits blue light, and a subpixel (X) that exhibits light of a color other than RGB. The light of a color other than RGB can be white (W) light, yellow (Y) light, cyan (C) light, magenta (M) light, infrared light (IR), or the like. In the case where the subpixel (X) exhibits infrared light, the subpixel (PD) having a light-receiving function preferably has a function of detecting infrared light. The subpixel (PD) having a light-receiving function may have a function of detecting both visible light and infrared light. The wavelength of light that the light-emitting and light-receiving device detects can be determined depending on the application of the sensor. Also in a display apparatus including a pixel composed of four subpixels of R, G, B, and X, a light-emitting device used in the R subpixel can be replaced with a light-emitting and light-receiving device, so that the display apparatus can have a light-receiving function in the pixel.

Figure 4D:
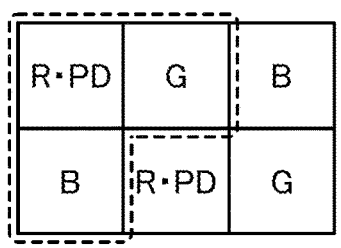

FIG. 4D illustrates two pixels, each of which is composed of three subpixels surrounded by dotted lines. The pixel illustrated in FIG. 4D includes a subpixel (R·PD) that exhibits red light and has a light-receiving function, a subpixel (G) that exhibits green light, and a subpixel (B) that exhibits blue light. In the pixel on the left in FIG. 4D, the subpixel (G) is positioned in the same row as the subpixel (R·PD), and the subpixel (B) is positioned in the same column as the subpixel (R·PD). In the pixel on the right in FIG. 4D, the subpixel (G) is positioned in the same row as the subpixel (R·PD), and the subpixel (B) is positioned in the same column as the subpixel (G). In every odd-numbered row and every even-numbered row of the pixel layout illustrated in FIG. 4D, the subpixel (R·PD), the subpixel (G), and the subpixel (B) are repeatedly arranged. In addition, subpixels of different colors are arranged in the odd-numbered row and the even-numbered row in every column.

Figure 4F:
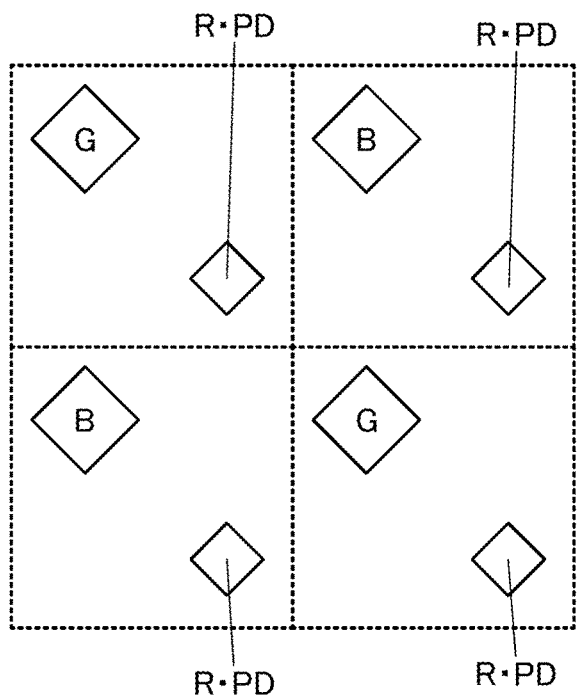

FIG. 4E illustrates four pixels which employ pentile arrangement; adjacent two pixels each have a different combination of two subpixels that exhibit light of different colors. Note that the shapes of the subpixels illustrated in FIG. 4E each indicate a top-surface shape of the light-emitting device or the light-emitting and light-receiving device included in the subpixel. FIG. 4F is a modification example of the pixel arrangement of FIG. 4E.

The upper-left pixel and the lower-right pixel in FIG. 4E each include a subpixel (R·PD) that exhibits red light and has a light-receiving function and a subpixel (G) that exhibits green light. The lower-left pixel and the upper-right pixel in FIG. 4E each include a subpixel (G) that exhibits green light and a subpixel (B) that exhibits blue light.

The upper-left pixel and the lower-right pixel in FIG. 4F each include a subpixel (R·PD) that exhibits red light and has a light-receiving function and a subpixel (G) that exhibits green light. The lower-left pixel and the upper-right pixel in FIG. 4F each include a subpixel (R·PD) that exhibits red light and has a light-receiving function and a subpixel (B) that exhibits blue light.

In FIG. 4E, the subpixel (G) that exhibits green light is provided in each pixel. Meanwhile, in FIG. 4F, the subpixel (R·PD) that exhibits red light and has a light-receiving function is provided in each pixel. The structure illustrated in FIG. 4F achieves higher-resolution image capturing than the structure illustrated in FIG. 4E because a subpixel having a light-receiving function is provided in each pixel. Thus, the accuracy of biometric authentication can be increased, for example.

The top-surface shape of the light-emitting devices and the light-emitting and light-receiving devices is not particularly limited and can be a circular shape, an elliptical shape, a polygonal shape, a polygonal shape with rounded corners, or the like. The top-surface shape of the light-emitting devices included in the subpixels (G) is a circular in the example in FIG. 4E and square in the example in FIG. 4F. The top-surface shape of the light-emitting devices and the light-emitting and light-receiving devices may vary depending on the colors thereof, or may be the same among the light-emitting devices and the light-emitting and light-receiving devices of some colors or all colors.

The aperture ratio of subpixels may vary depending on the color thereof, or may be the same among the subpixels of some colors or all colors. For example, the aperture ratio of a subpixel provided in each pixel (the subpixel (G) in FIG. 4E, and the subpixel (R·PD) in FIG. 4F) may be made lower than that of a subpixel of another color.

Figure 4G:
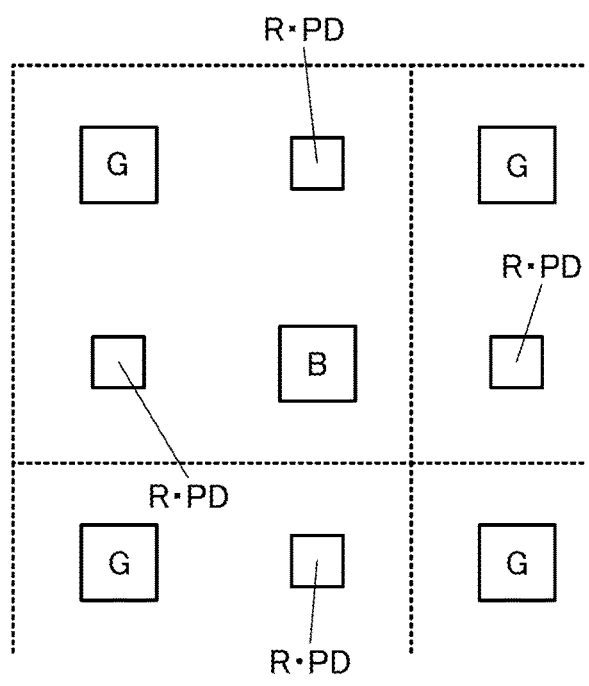

FIG. 4G is a modification example of the pixel arrangement of FIG. 4F. Specifically, the structure of FIG. 4G is obtained by rotating the structure of FIG. 4F by 45°. Although one pixel is regarded as being formed of two subpixels in FIG. 4F, one pixel can be regarded as being formed of four subpixels as illustrated in FIG. 4G.

In the description with reference to FIG. 4G, one pixel is regarded as being formed of four subpixels surrounded by dotted lines. A pixel includes two subpixels (R·PD), one subpixel (G), and one subpixel (B). The pixel including a plurality of subpixels having a light-receiving function allows high-resolution image capturing. Accordingly, the accuracy of biometric authentication can be increased. For example, the resolution of image capturing can be the square root of 2 times the resolution of display.

A display apparatus which employs the structure illustrated in FIG. 4F or FIG. 4G includes p (p is an integer greater than or equal to 2) first light-emitting devices, q (q is an integer greater than or equal to 2) second light-emitting devices, and r (r is an integer greater than p and greater than q) light-emitting and light-receiving devices. As for p and r, r=2p is satisfied. As for p, q, and r, r=p+q is satisfied. Either the first light-emitting devices or the second light-emitting devices emits green light, and the other light-emitting devices emit blue light. The light-emitting and light-receiving devices emit red light and have a light-receiving function.

In the case where touch detection is performed with the light-emitting and light-receiving devices, for example, it is preferable that light emitted from a light source be hard for a user to recognize. Since blue light has low visibility than green light, light-emitting devices that emit blue light are preferably used as a light source. Accordingly, the light-emitting and light-receiving devices preferably have a function of receiving blue light and converting it into an electric signal.

As described above, the display apparatus of this embodiment can employ any of various types of pixel arrangements.

[Device Structure]

Figure 5A:
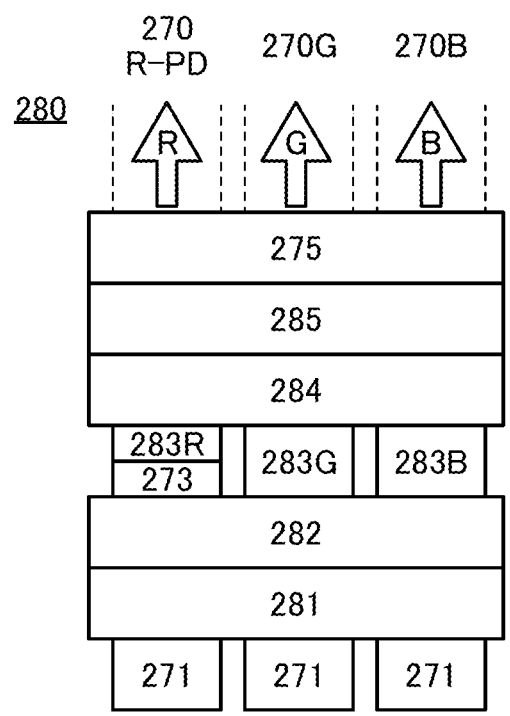
FIG. 5A and FIG. 5B are cross-sectional views illustrating examples of a display apparatus.
Figure 5B:
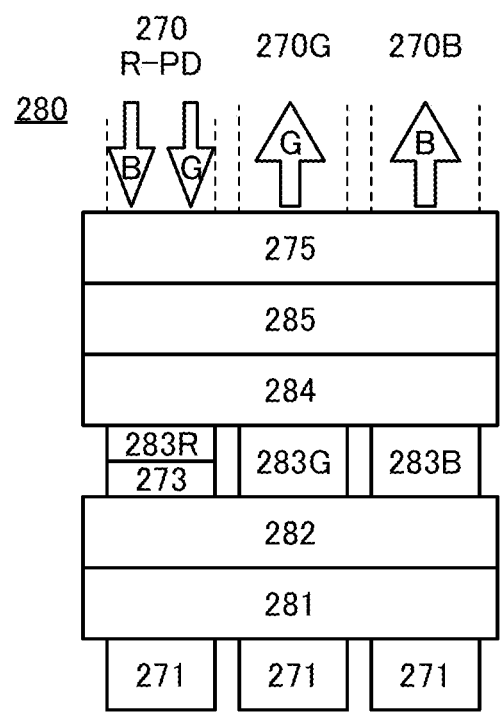

A display apparatus 280 illustrated in FIG. 5A and FIG. 5B includes a light-emitting and light-receiving device 270R-PD that emits red (R) light and has a light-receiving function, the light-emitting device 270G that emits green (G) light, and the light-emitting device 270B that emits blue (B) light.

Each of the light-emitting devices includes a pixel electrode 271, a hole-injection layer 281, a hole-transport layer 282, a light-emitting layer, an electron-transport layer 284, an electron-injection layer 285, and a common electrode 275 which are stacked in this order. The light-emitting device 270G includes a light-emitting layer 283G, and the light-emitting device 270B includes a light-emitting layer 283B. The light-emitting layer 283G includes a light-emitting substance that emits green light, and the light-emitting layer 283B includes a light-emitting substance that emits blue light.

The light-emitting and light-receiving device 270R-PD includes the pixel electrode 271, the hole-injection layer 281, the hole-transport layer 282, an active layer 273, a light-emitting layer 283R, the electron-transport layer 284, the electron-injection layer 285, and the common electrode 275 which are stacked in this order.

FIG. 5A illustrates a case where the light-emitting and light-receiving device 270R-PD functions as a light-emitting device. FIG. 5A illustrates an example in which the light-emitting device 270B emits blue light, the light-emitting device 270G emits green light, and the light-emitting and light-receiving device 270R-PD emits red light.

FIG. 5B illustrates a case where the light-emitting and light-receiving device 270R-PD functions as a light-receiving device. FIG. 5B illustrates an example in which the light-emitting and light-receiving device 270R-PD detects blue light emitted by the light-emitting device 270B and green light emitted by the light-emitting device 270G.

The light-emitting device 270B, the light-emitting device 270G, and the light-emitting and light-receiving device 270R-PD each include the pixel electrode 271 and the common electrode 275. In this embodiment, the case where the pixel electrode 271 functions as an anode and the common electrode 275 functions as a cathode is described as an example.

In the description made in this embodiment, also in the light-emitting and light-receiving device 270R-PD, the pixel electrode 271 functions as an anode and the common electrode 275 functions as a cathode as in the light-emitting device. In other words, when the light-emitting and light-receiving device 270R-PD is driven by application of reverse bias between the pixel electrode 271 and the common electrode 275, light entering the light-emitting and light-receiving device 270R-PD can be detected and charge can be generated and extracted as current.

Note that it can be said that the light-emitting and light-receiving device 270R-PD illustrated in FIG. 5A and FIG. 5B has a structure in which the active layer 273 is added to the light-emitting device. That is, the light-emitting and light-receiving device 270R-PD can be formed concurrently with formation of a light-emitting device only by adding a step of forming the active layer 273 in the manufacturing process of the light-emitting device. The light-emitting device and the light-emitting and light-receiving device can be formed over the same substrate. Thus, the display portion can be provided with one or both of an image-capturing function and a sensing function without a significant increase in the number of manufacturing steps.

[Light-Emitting and Light-Receiving Device]

FIG. 5C to FIG. 5F illustrate examples of a stacked-layer structure of the light-emitting and light-receiving device.

Figure 5C:
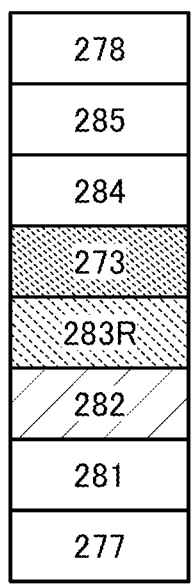
FIG. 5C to FIG. 5F are cross-sectional views illustrating examples of a light-emitting and light-receiving device.
Figure 5D:
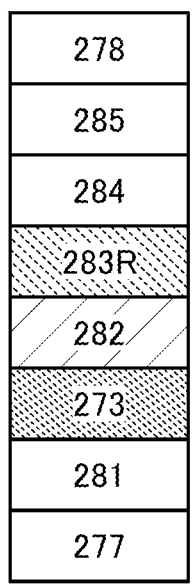

The light-emitting and light-receiving devices illustrated in FIG. 5C and FIG. 5D each include a first electrode 277, the hole-injection layer 281, the hole-transport layer 282, the light-emitting layer 283R, the active layer 273, the electron-transport layer 284, the electron-injection layer 285, and a second electrode 278.

The stacking order of the light-emitting layer 283R and the active layer 273 is not limited. FIG. 5A and FIG. 5B each illustrate an example in which the active layer 273 is provided over the hole-transport layer 282, and the light-emitting layer 283R is provided over the active layer 273. FIG. 5C illustrates an example in which the light-emitting layer 283R is provided over the hole-transport layer 282, and the active layer 273 is provided over the light-emitting layer 283R. In FIG. 5D, the hole-transport layer 282 is provided over the active layer 273, and the light-emitting layer 263R is provided over the hole-transport layer 282.

As illustrated in FIG. 5A to FIG. 5C, the active layer 273 and the light-emitting layer 283R may be in contact with each other. As illustrated in FIG. 5D, a buffer layer is preferably provided between the active layer 273 and the light-emitting layer 283R. The buffer layer preferably has a hole-transport property and an electron-transport property. For example, a substance with a bipolar property is preferably used for the buffer layer. Alternatively, as the buffer layer, at least one layer of a hole-injection layer, a hole-transport layer, an electron-transport layer, an electron-injection layer, a hole-blocking layer, an electron-blocking layer, and the like can be used. FIG. 5D illustrates an example in which the hole-transport layer 282 is used as the buffer layer.

The buffer layer provided between the active layer 273 and the light-emitting layer 283R can inhibit transfer of excitation energy from the light-emitting layer 283R to the active layer 273. Furthermore, the buffer layer can also be used to adjust the optical path length (cavity length) of the microcavity structure. Thus, a high emission efficiency can be obtained from the light-emitting and light-receiving device including the buffer layer between the active layer 273 and the light-emitting layer 283R.

Figure 5E:
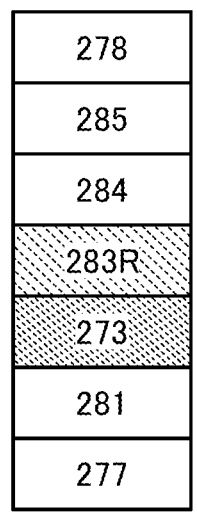

The light-emitting and light-receiving device illustrated in FIG. 5E is different from the light-emitting and light-receiving devices illustrated in FIG. 5A, FIG. 5B, and FIG. 5D in not including the hole-transport layer 282. The light-emitting and light-receiving device may exclude at least one of the hole-injection layer 281, the hole-transport layer 282, the electron-transport layer 284, and the electron-injection layer 285. Furthermore, the light-emitting and light-receiving device may include another functional layer such as a hole-blocking layer or an electron-blocking layer.

Figure 5F:
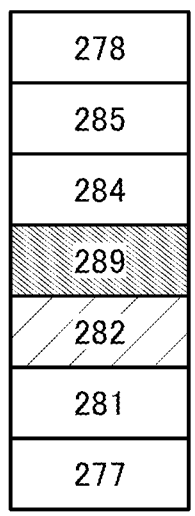

The light-emitting and light-receiving device illustrated in FIG. 5F is different from the light-emitting and light-receiving devices illustrated in FIG. 5A to FIG. 5E in including a layer 289 serving as both a light-emitting layer and an active layer instead of including the active layer 273 and the light-emitting layer 283R.

As the layer 289 serving as both a light-emitting layer and an active layer, a layer containing three materials which are an n-type semiconductor that can be used for the active layer 273, a p-type semiconductor that can be used for the active layer 273, and a light-emitting substance that can be used for the light-emitting layer 283R can be used, for example.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

In the light-emitting and light-receiving device, a conductive film that transmits visible light is used as the electrode through which light is extracted. A conductive film that reflects visible light is preferably used as the electrode through which light is not extracted.

When the light-emitting and light-receiving device is driven as a light-emitting device, the hole-injection layer serves as a layer that injects holes from the anode to the hole-transport layer. The hole-injection layer is a layer containing a material with a high hole-injection property. As the material with a high hole-injection property, an aromatic amine compound and a composite material containing a hole-transport material and an acceptor material (electron-accepting material) can be used.

When the light-emitting and light-receiving device is driven as a light-emitting device, the hole-transport layer serves as a layer that transports holes injected from the anode by the hole-injection layer, to the light-emitting layer. When the light-emitting and light-receiving device is driven as a light-receiving device, the hole-transport layer serves as a layer that transports holes generated in the active layer on the basis of incident light, to the anode. The hole-transport layer is a layer containing a hole-transport material. As the hole-transport material, a substance having a hole mobility greater than or equal to $10^{-6}$ cm$^2$/Vs is preferable. Note that other substances can also be used as long as they have a property of transporting more holes than electrons. As the hole-transport material, materials having a high hole-transport property, such as a π-electron-rich heteroaromatic compound (e.g., a carbazole derivative, a thiophene derivative, and a furan derivative) and an aromatic amine (a compound having an aromatic amine skeleton), are preferable.

When the light-emitting and light-receiving device is driven as a light-emitting device, the electron-transport layer serves as a layer that transports electrons injected from the cathode by the electron-injection layer, to the light-emitting layer. When the light-emitting and light-receiving device is driven as a light-receiving device, the electron-transport layer serves as a layer that transports electrons generated in the active layer on the basis of incident light, to the cathode. The electron-transport layer is a layer containing an electron-transport material. As the electron-transport material, a substance with an electron mobility greater than or equal to $1\times10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

When the light-emitting and light-receiving device is driven as a light-emitting device, the electron-injection layer serves as a layer that injects electrons from the cathode to the electron-transport layer. The electron-injection layer is a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 193 is a layer that contains a light-emitting substance. The light-emitting layer 193 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material are a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 193 may contain one or more kinds of organic compounds (e.g., a host material and an assist material) in addition to the light-emitting substance (guest material). As the one or more kinds of organic compounds, one or both of the hole-transport material and the electron-transport material can be used. As the one or more kinds of organic compounds, a substance with a bipolar property or a TADF material may be used.

The light-emitting layer 193 preferably contains a phosphorescent material and a combination of a hole-transport material and an electron-transport material that easily forms an exciplex. With such a structure, light emission can be efficiently obtained by ExTET (Exciplex—Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

In the combination of materials for forming an exciplex, the HOMO level (the highest occupied molecular orbital level) of the hole-transport material is preferably higher than or equal to the HOMO level of the electron-transport material. In addition, the LUMO level (the lowest unoccupied molecular orbital level) of the hole-transport material is preferably higher than or equal to the LUMO level of the electron-transport material. Note that the LUMO levels and the HOMO levels of the materials can be derived from the electrochemical characteristics (the reduction potentials and the oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 183 contains a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer 193 and the active layer 183 can be formed by the same method (e.g., a vacuum evaporation method) and thus the same manufacturing apparatus can be used.

Examples of an n-type semiconductor material contained in the active layer 183 are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for light-receiving devices. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of the p-type semiconductor material contained in the active layer 183 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of the p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 183 is preferably formed by co-evaporation of an n-type semiconductor and a p-type semiconductor.

The layer 289 serving as both a light-emitting layer and an active layer is preferably formed using the above-described light-emitting substance, n-type semiconductor, and p-type semiconductor.

The hole-injection layer 281, the hole-transport layer 282, the active layer 183, the light-emitting layer 193, the electron-transport layer 284, the electron-injection layer 285, and the layer 289 serving as both a light-emitting layer and an active layer may be formed using either a low-molecular compound or a high-molecular compound and may contain an inorganic compound. Each layer can be formed by an evaporation method (including a vacuum evaporation method), a transfer method, a printing method, an inkjet method, a coating method, or the like.

A more detailed structure of the display apparatus of one embodiment of the present invention will be described below with reference to FIG. 6 to FIG. 9.

[Display Apparatus 100A]

Figure 6:
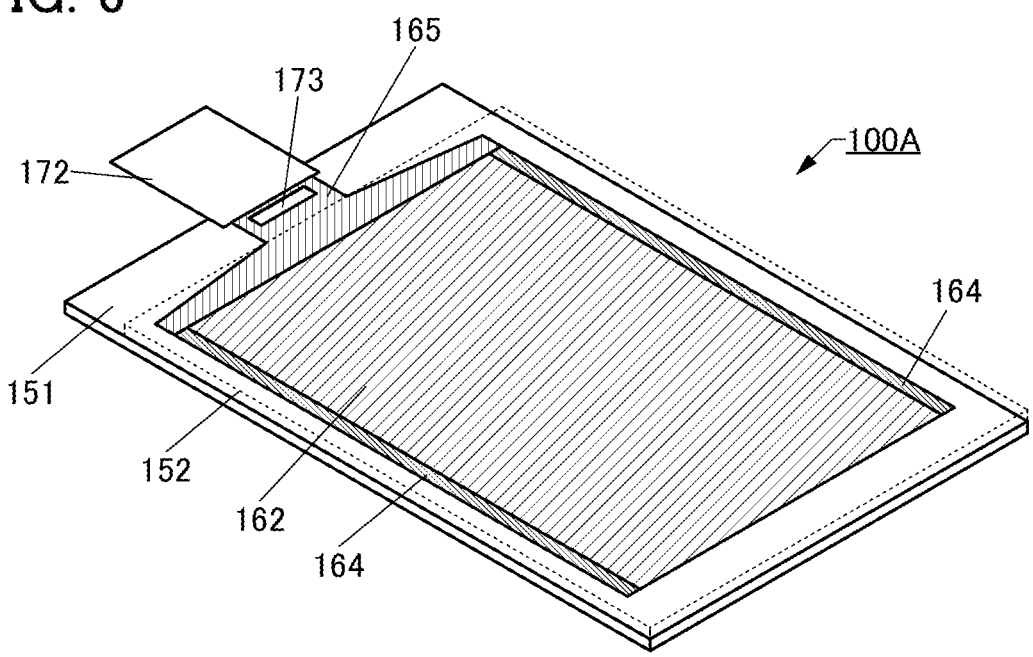
FIG. 6 is a perspective view illustrating an example of a display apparatus.
Figure 7:
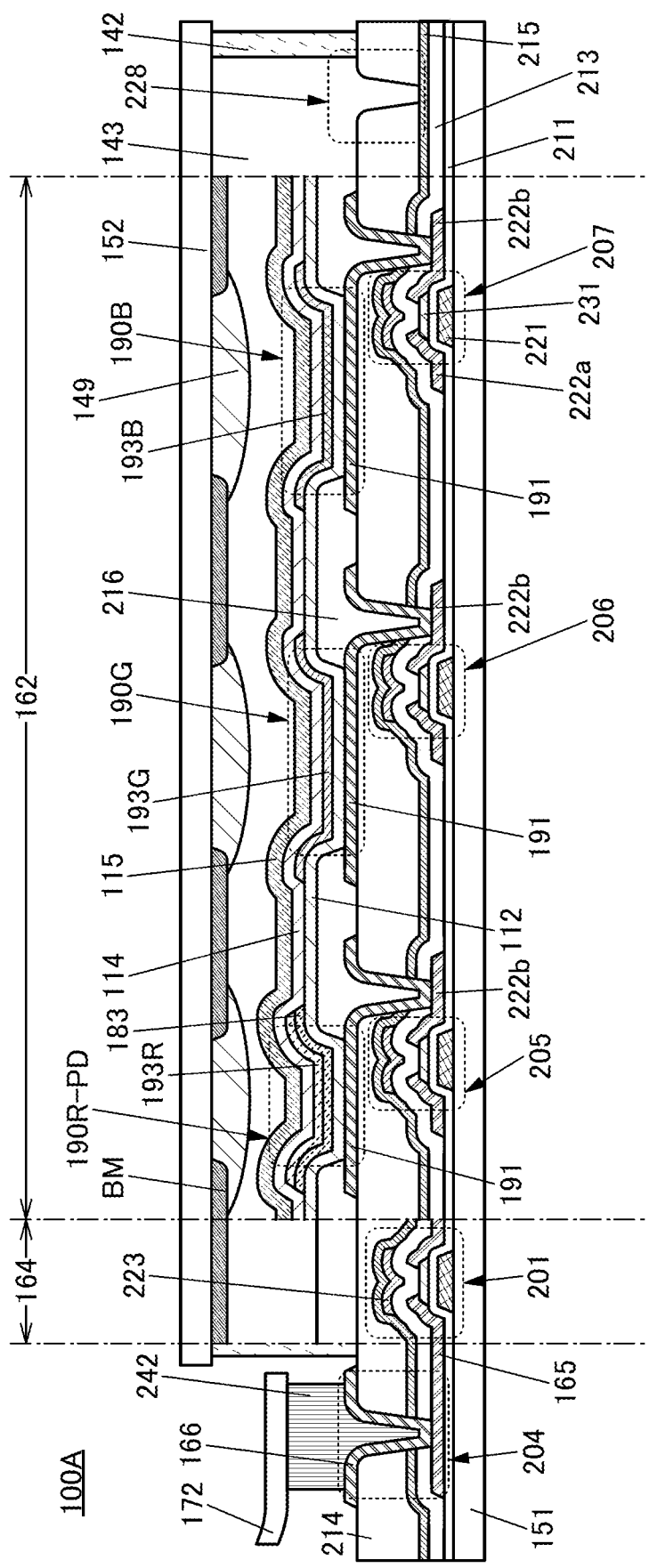
FIG. 7 is a cross-sectional view illustrating an example of a display apparatus.

FIG. 6 illustrates a perspective view of a display apparatus 100A, and FIG. 7 illustrates a cross-sectional view of the display apparatus 100A.

The display apparatus 100A has a structure in which the substrate 152 and the substrate 151 are bonded to each other. In FIG. 6, the substrate 152 is denoted by dashed lines.

The display apparatus 100A includes a display portion 162, a circuit 164, a wiring 165, and the like. FIG. 6 illustrates an example in which an IC (integrated circuit) 173 and an FPC 172 are mounted on the display apparatus 100A.

Thus, the structure illustrated in FIG. 6 can be regarded as a display module including the display apparatus 100A, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or from the IC 173.

FIG. 6 illustrates an example in which the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display apparatus 100A and the display module may have a structure not including an IC. The IC may be mounted on the FPC by a COF method or the like.

FIG. 7 illustrates an example of a cross section of part of a region including the FPC 172, part of a region including the circuit 164, part of a region including the display portion 162, and part of a region including an end portion of the display apparatus 100A illustrated in FIG. 6.

The display apparatus 100A in FIG. 7 includes a transistor 201, a transistor 205, a transistor 206, a transistor 207, the light-emitting device 190B, the light-emitting device 190G, the light-emitting and light-receiving device 190R-PD, the lens 149, and the like between the substrate 151 and the substrate 152.

The substrate 152 and the insulating layer 214 are bonded to each other with the adhesive layer 142. A solid sealing structure, a hollow sealing structure, or the like can be employed to seal the light-emitting device 190B, the light-emitting device 190G, and the light-emitting and light-receiving device 190R-PD. In FIG. 7, a hollow sealing structure is employed in which a space 143 surrounded by the substrate 152, the adhesive layer 142, and the insulating layer 214 is filled with an inert gas (e.g., nitrogen or argon). The adhesive layer 142 may overlap with the light-emitting device 190B, the light-emitting device 190G, and the light-emitting and light-receiving device 190R-PD. The space 143 surrounded by the substrate 152, the adhesive layer 142, and the insulating layer 214 may be filled with a resin different from that of the adhesive layer 142.

The light-emitting device 190B has a stacked-layer structure in which the pixel electrode 191, the common layer 112, the light-emitting layer 193B, the common layer 114, and the common electrode 115 are stacked in this order from the insulating layer 214 side. The pixel electrode 191 is connected to a conductive layer 222b included in the transistor 207 through an opening provided in the insulating layer 214. The transistor 207 has a function of controlling the driving of the light-emitting device 190B. An end portion of the pixel electrode 191 is covered with the partition 216. The pixel electrode 191 contains a material that reflects visible light, and the common electrode 115 contains a material that transmits visible light.

The light-emitting device 190G has a stacked-layer structure in which the pixel electrode 191, the common layer 112, the light-emitting layer 193G, the common layer 114, and the common electrode 115 are stacked in this order from the insulating layer 214 side. The pixel electrode 191 is connected to the conductive layer 222b included in the transistor 206 through an opening provided in the insulating layer 214. The transistor 206 has a function of controlling the driving of the light-emitting device 190G.

The light-emitting and light-receiving device 190R-PD has a stacked-layer structure in which the pixel electrode 191, the common layer 112, the active layer 183, the light-emitting layer 193R, the common layer 114, and the common electrode 115 are stacked in this order from the insulating layer 214 side. The pixel electrode 191 is electrically connected to the conductive layer 222b included in the transistor 205 through an opening provided in the insulating layer 214. The transistor 205 has a function of controlling the driving of the light-emitting and light-receiving device 190R-PD.

Light emitted by the light-emitting device 190B, the light-emitting device 190G, and the light-emitting and light-receiving device 190R-PD is emitted toward the substrate 152 through the lens 149. Light enters the light-emitting and light-receiving device 190R-PD through the substrate 152, the space 143, and the lens 149. For each of the lens 149 and the substrate 152, a material that has high transmittance with respect to visible light is preferably used.

When light enters the light-emitting and light-receiving device 190R-PD through the lens 149, a range of the light entering the light-emitting and light-receiving device 190R-PD can be reduced. Thus, overlap of image-capturing ranges between the plurality of light-emitting and light-receiving devices 190R-PD can be inhibited, whereby a clear image with little blurring can be captured.

In addition, the lens 149 can condense the incident light. Accordingly, the amount of light entering the light-emitting and light-receiving device 190R-PD can be increased. Thus, the photoelectric conversion efficiency of the light-emitting and light-receiving device 190R-PD can be increased. In addition, light emitted by the light-emitting and light-receiving device 190R-PD and the light-emitting devices 190G and 190B can be efficiently extracted to the outside of the display apparatus 100A. This can increase the light extraction efficiency of the display apparatus 100A.

The pixel electrodes 191 can be formed using the same material in the same step. The common layer 112, the common layer 114, and the common electrode 115 are shared by the light-emitting device 190B, the light-emitting device 190G, and the light-emitting and light-receiving device 190R-PD. The light-emitting and light-receiving device 190R-PD has the structure of the red-light-emitting device to which the active layer 183 is added. The light-emitting device 190B, the light-emitting device 190G, and the light-emitting and light-receiving device 190R-PD can have a common structure except for the active layer 183 and the light-emitting layer 193 of each color. Thus, the display portion 162 of the display apparatus 100A can have a light-receiving function without a significant increase in the number of manufacturing steps.

The light-blocking layer BM is provided on the surface of the substrate 152 on the substrate 151 side. The light-blocking layer BM includes openings in the positions overlapping with the light-emitting device 190B, the light-emitting device 190G, and the light-emitting and light-receiving device 190R-PD. Providing the light-blocking layer BM can control the range where the light-emitting and light-receiving device 190R-PD detects light. Furthermore, with the light-blocking layer BM, light can be inhibited from entering the light-emitting and light-receiving device 190R-PD from the light-emitting device 190 without through an object. Hence, a sensor with less noise and high sensitivity can be obtained.

The transistor 201, the transistor 205, the transistor 206, and the transistor 207 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water and hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. Note that a base film may be provided between the substrate 151 and the transistors. Any of the above-described inorganic insulating films can be used as the base film.

Here, an organic insulating film often has a lower barrier property than an inorganic insulating film. Therefore, the organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that an end portion of the organic insulating film is positioned on the inner side than the end portion of the display apparatus 100A is, to prevent the organic insulating film from being exposed at the end portion of the display apparatus 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 7, an opening is formed in the insulating layer 214. This can inhibit entry of impurities into the display portion 162 from the outside through the insulating layer 214 even when an organic insulating film is used as the insulating layer 214. Thus, the reliability of the display apparatus 100A can be increased.

Each of the transistor 201, the transistor 205, the transistor 206, and the transistor 207 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 205, the transistor 206, and the transistor 207. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used in the transistor, and an amorphous semiconductor or a semiconductor having crystallinity (a microcrystalline semiconductor, a polycrystalline semiconductor, a single crystal semiconductor, or a semiconductor partly including crystal regions) can be used. It is preferable to use a semiconductor having crystallinity, in which case degradation of the transistor characteristics can be inhibited.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature polysilicon or single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of Min the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 204 is provided in a region of the substrate 151 that does not overlap with the substrate 152. In the connection portion 204, the wiring 165 is electrically connected to the FPC 172 via a conductive layer 166 and a connection layer 242. On a top surface of the connection portion 204, the conductive layer 166 obtained by processing the same conductive film as the pixel electrode 191 is exposed. Thus, the connection portion 204 and the FPC 172 can be electrically connected to each other through the connection layer 242.

A variety of optical members can be arranged on the outer surface of the substrate 152. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outside of the substrate 152.

For each of the substrate 151 and the substrate 152, glass, quartz, ceramic, sapphire, resin, or the like can be used. When a flexible material is used for the substrate 151 and the substrate 152, the flexibility of the display apparatus can be increased.

As the connection layer, an anisotropic conductive film (ACF), an anisotropic conductive paste (ACP), or the like can be used.

As materials that can be used for a gate, a source, and a drain of a transistor and conductive layers such as a variety of wirings and electrodes included in a display apparatus, metals such as aluminum, titanium, chromium, nickel, copper, yttrium, zirconium, molybdenum, silver, tantalum, or tungsten, an alloy containing any of these metals as its main component, and the like can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used for conductive layers such as a variety of wirings and electrodes included in the display apparatus, and conductive layers (conductive layers functioning as pixel electrodes or common electrodes) included in the light-emitting device and the light-emitting and light-receiving device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Apparatus 100B]

FIG. 8A illustrates a cross-sectional view of a display apparatus 100B.

The display apparatus 100B is different from the display apparatus 100A mainly in that the display apparatus 100B includes the protective layer 195 and has a solid sealing structure. Detailed description of a structure similar to that of the display apparatus 100A is omitted.

When the protective layer 195 covering the light-emitting device 190B, the light-emitting device 190G, and the light-emitting and light-receiving device 190R-PD is provided, impurities such as water can be inhibited from entering the light-emitting device 190B, the light-emitting device 190G, and the light-emitting and light-receiving device 190R-PD, so that the reliabilities of the light-emitting device 190B, the light-emitting device 190G, and the light-emitting and light-receiving device 190R-PD can be increased.

In the region 228 in the vicinity of an end portion of the display apparatus 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. Thus, the reliability of the display apparatus 100B can be increased.

The protective layer 195 may have a single-layer structure or a stacked-layer structure; for example, the protective layer 195 may have a three-layer structure that includes an inorganic insulating layer over the common electrode 115, an organic insulating layer over the inorganic insulating layer, and an inorganic insulating layer over the organic insulating layer. In that case, an end portion of the inorganic insulating film preferably extends beyond an end portion of the organic insulating film.

In the display apparatus 100B, the protective layer 195 and the substrate 152 are bonded to each other with the adhesive layer 142. The adhesive layer 142 is provided to overlap with each of the light-emitting device 190B, the light-emitting device 190G, and the light-emitting and light-receiving device 190R-PD; that is, the display apparatus 100B employs a solid sealing structure.

Note that a light-emitting layer included in a light-emitting device may include a portion overlapping with a light-emitting layer and an active layer included in a light-emitting and light-receiving device. Similarly, a light-emitting layer included in a light-emitting device may include a portion overlapping with a light-emitting layer included in another light-emitting device. With such a structure, the resolution of the display apparatus can be increased. For example, FIG. 8B illustrates an example in which over the partition 216, the light-emitting layer 193G included in the light-emitting device 190G overlaps with the active layer 183 and the light-emitting layer 193R that are included in the light-emitting and light-receiving device 190R-PD.

[Display Apparatus 100C]

FIG. 9A illustrates a cross-sectional view of a display apparatus 100C.

A display apparatus 100C is different from the display apparatus 100B in that the lens 149 is provided on and in contact with the protective layer 195. Even with such a structure, the sensitivity of the photoelectric conversion function and the light extraction efficiency of the display apparatus can be increased.

Furthermore, the display apparatus 100C is different from the display apparatus 100B in transistor structures.

The display apparatus 100C includes a transistor 208, a transistor 209, and a transistor 210 over the substrate 153.

Each of the transistor 208, the transistor 209, and the transistor 210 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 225 and the insulating layer 215. One of the conductive layer 222a and the conductive layer 222b serves as a source, and the other serves as a drain.

The pixel electrode 191 of the light-emitting device 190G is electrically connected to one of the pair of low-resistance regions 231n of the transistor 208 through the conductive layer 222b.

The pixel electrode 191 of the light-emitting and light-receiving device 190R-PD is electrically connected to one of the pair of low-resistance regions 231n of the transistor 209 through the conductive layer 222b.

FIG. 9A illustrates an example in which the insulating layer 225 covers a top surface and a side surface of the semiconductor layer. Meanwhile, in a transistor 202 illustrated in FIG. 9B, the insulating layer 225 overlaps with the channel formation region 231i of the semiconductor layer 231 and does not overlap with the low-resistance regions 231n. The structure illustrated in FIG. 9B can be manufactured by processing the insulating layer 225 with the conductive layer 223 as a mask, for example. In the transistor 202, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer 218 covering the transistor may be provided.

In addition, the display apparatus 100C is different from the display apparatus 100B in that neither the substrate 151 nor the substrate 152 is included and the substrate 153, the substrate 154, the adhesive layer 155, and the insulating layer 212 are included.

The substrate 153 and the insulating layer 212 are bonded to each other with the adhesive layer 155. The substrate 154 and the protective layer 195 are bonded to each other with the adhesive layer 142.

The display apparatus 100C is formed in such a manner that the insulating layer 212, the transistor 208, the transistor 209, the transistor 210, the light-emitting and light-receiving device 190R-PD, the light-emitting device 190G, and the like which are formed over a formation substrate are transferred onto the substrate 153. The substrate 153 and the substrate 154 preferably have flexibility. Accordingly, the flexibility of the display apparatus 100C can be increased.

The inorganic insulating film that can be used as the insulating layer 211, the insulating layer 213, and the insulating layer 215 can be used as the insulating layer 212.

In the display apparatus of this embodiment, a subpixel exhibiting light of any of the colors includes a light-emitting and light-receiving device instead of a light-emitting device as described above. The light-emitting and light-receiving device functions as both a light-emitting device and a light-receiving device, whereby the pixel can have a light-receiving function without an increase in the number of subpixels included in the pixel. Furthermore, the pixel can be provided with a light-receiving function without a reduction in the resolution of the display apparatus or a reduction in the aperture ratio of each subpixel.

In the display apparatus of this embodiment, light enters the light-emitting and light-receiving device through the lens, whereby the photoelectric conversion efficiency of the light-emitting and light-receiving device can be increased. In addition, in the display apparatus of this embodiment, light emitted by each of the light-emitting and light-receiving device and the light-emitting device is emitted to the outside of the display apparatus through the lens, which can increase the light extraction efficiency of the display apparatus.

This embodiment can be combined with the other embodiments as appropriate. In this specification, in the case where a plurality of structure examples are shown in one embodiment, the structure examples can be combined as appropriate.

Embodiment 2

Described in this embodiment is a metal oxide (hereinafter also referred to as an oxide semiconductor) that can be used in an OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

«Structure of Oxide Semiconductor»

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution transmission electron microscope (TEM) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. Furthermore, a pentagonal or heptagonal lattice arrangement, for example, is included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

«Structure of Oxide Semiconductor»

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, [In] of the first region in the CAC-OS in the In—Ga—Zn oxide is higher than [In] in the composition of the CAC-OS film. Moreover, [Ga] of the second region is higher than [Ga] in the composition of the CAC-OS film. Alternatively, for example, the first region has higher [In] than the second region and lower [Ga] than the second region. Moreover, the second region has higher [Ga] than the first region and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible; for example, the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility (μ) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

A transistor using a CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved. An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. Thus, a transistor using an oxide semiconductor containing nitrogen as the semiconductor tends to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

This embodiment can be combined with the other embodiments as appropriate.

Embodiment 3

In this embodiment, electronic devices of embodiments of the present invention will be described with reference to FIG. 10 to FIG. 12.

An electronic device in this embodiment includes a display apparatus of one embodiment of the present invention.

For example, the display apparatus of one embodiment of the present invention can be used in a display portion of the electronic device. The display apparatus of one embodiment of the present invention has a function of detecting light, and thus can perform biological authentication with the display portion or detect touch (contact or a near touch) on the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 10A:
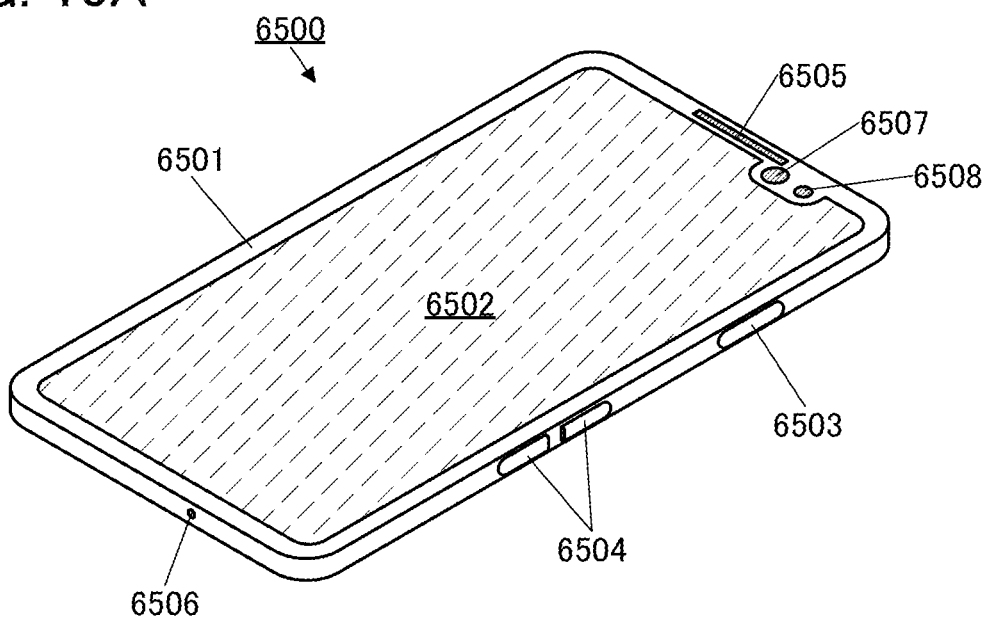
FIG. 10A and FIG. 10B are diagrams illustrating an example of an electronic device.

An electronic device 6500 illustrated in FIG. 10A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 10B:
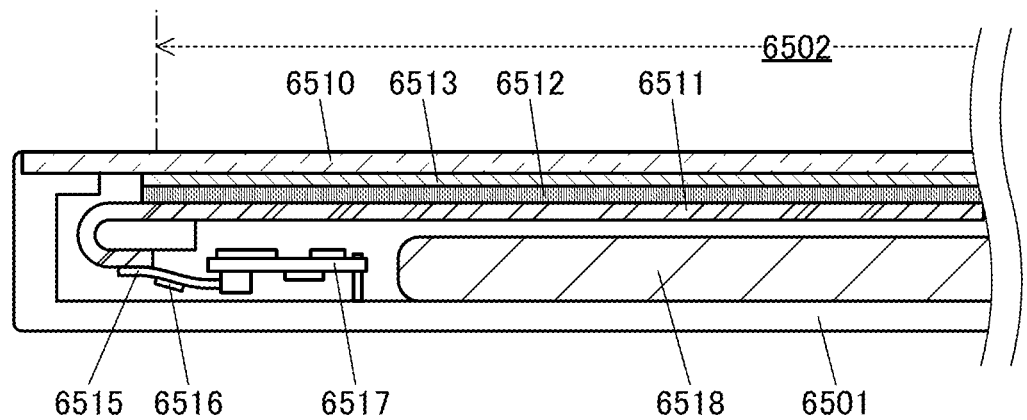

FIG. 10B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

Using the display apparatus of one embodiment of the present invention as the display panel 6511 allows image capturing on the display portion 6502. For example, an image of a fingerprint is captured by the display panel 6511; thus, fingerprint identification can be performed.

By further including the touch sensor panel 6513, the display portion 6502 can have a touch panel function. A variety of types such as a capacitive type, a resistive type, a surface acoustic wave type, an infrared type, an optical type, and a pressure-sensitive type can be used for the touch sensor panel 6513. Alternatively, the display panel 6511 may function as a touch sensor; in such a case, the touch sensor panel 6513 is not necessarily provided.

Figure 11A:
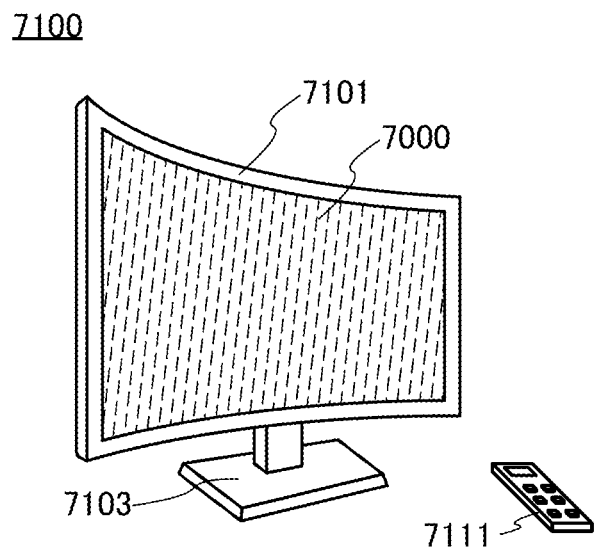
FIG. 11A to FIG. 11D are diagrams illustrating examples of electronic devices.

FIG. 11A illustrates an example of a television device. In a television device 7100, a display portion 7000 is incorporated in a housing 7101. Here, a structure in which the housing 7101 is supported by a stand 7103 is illustrated.

A display apparatus of one embodiment of the present invention can be used in the display portion 7000.

The television device 7100 illustrated in FIG. 11A can be operated with an operation switch provided in the housing 7101 or a separate remote controller 7111. Alternatively, the display portion 7000 may include a touch sensor, and the television device 7100 may be operated by a touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 11B:
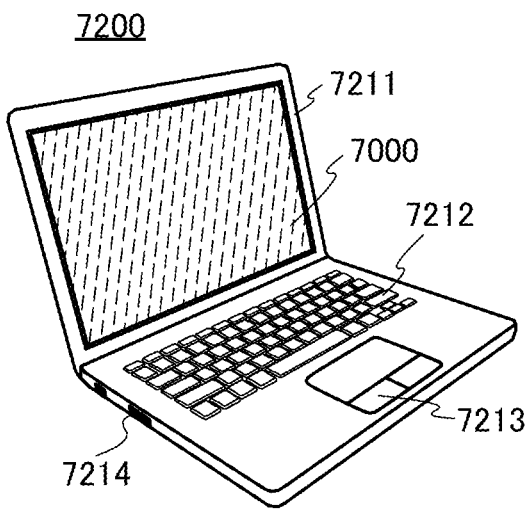

FIG. 11B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

A display apparatus of one embodiment of the present invention can be used in the display portion 7000.

Figure 11C:
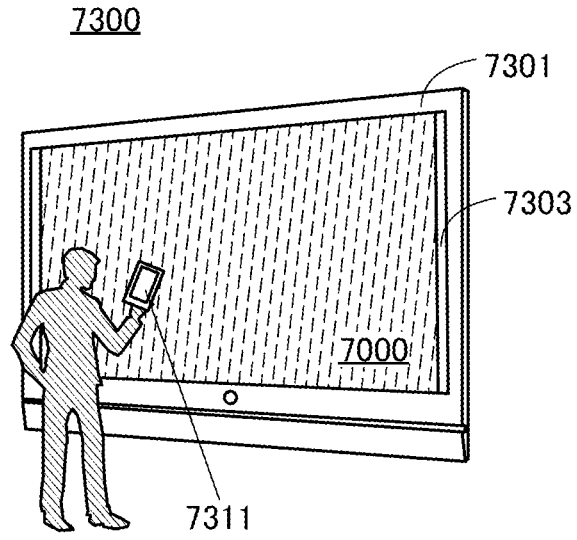
Figure 11D:
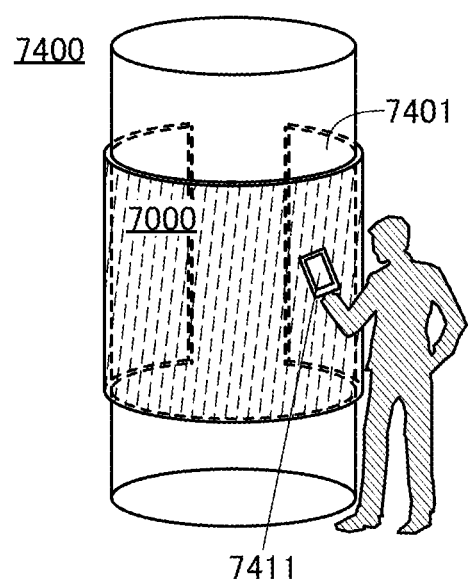

FIG. 11C and FIG. 11D illustrate examples of digital signage.

Digital signage 7300 illustrated in FIG. 11C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 11D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 11C and FIG. 11D.

A larger area of the display portion 7000 can increase the amount of data that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 11C and FIG. 11D, the digital signage 7300 or the digital signage 7400 is preferably capable of working with an information terminal 7311 or an information terminal 7411 such as a user's smartphone through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 12A to FIG. 12F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 12A to FIG. 12F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 12A to FIG. 12F are described below.

Figure 12A:
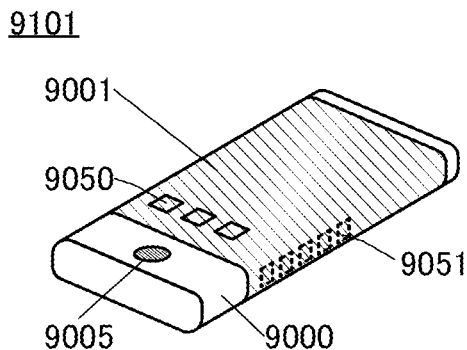
FIG. 12A to FIG. 12F are diagrams illustrating examples of electronic devices.

FIG. 12A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, and the like. The portable information terminal 9101 can display characters and image information on its plurality of surfaces. FIG. 12A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the radio field intensity. Alternatively, the icon 9050 or the like may be displayed in the position where the information 9051 is displayed.

Figure 12B:
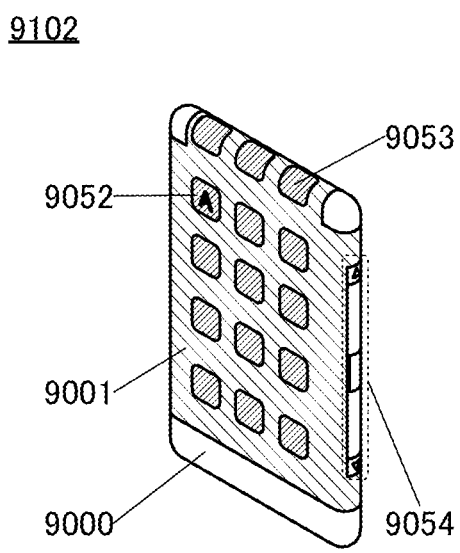

FIG. 12B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 12C:
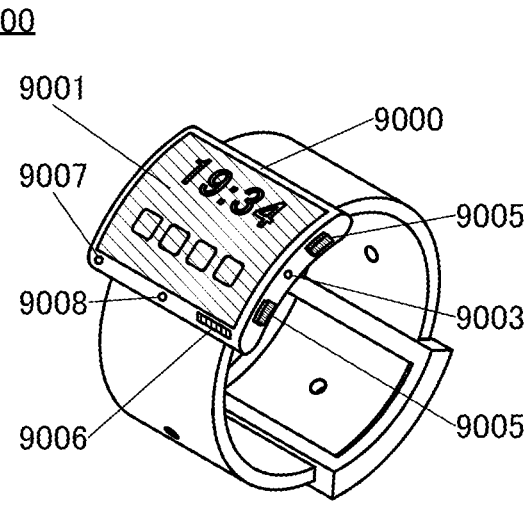

FIG. 12C is a perspective view illustrating a watch-type portable information terminal 9200. For example, the portable information terminal 9200 can be used as a smartwatch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 12D:
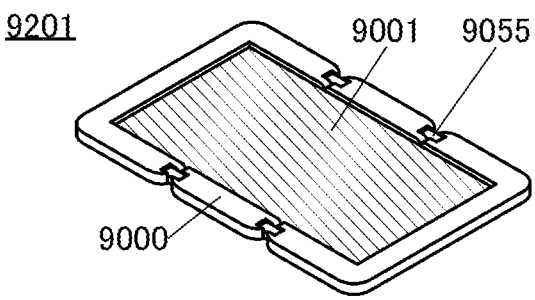
Figure 12E:
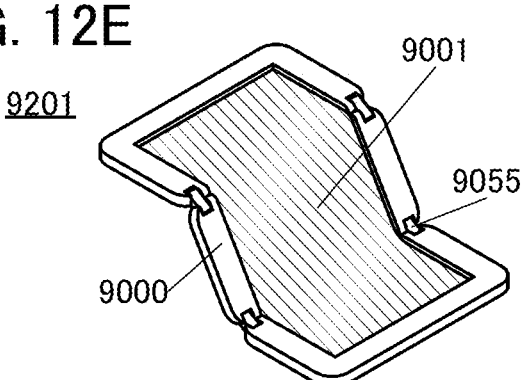
Figure 12F:
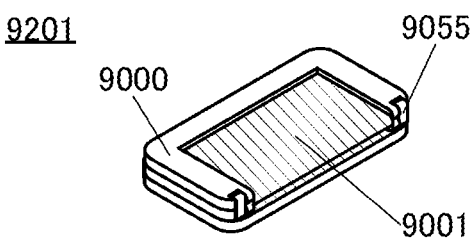

FIG. 12D to FIG. 12F are perspective views illustrating a foldable portable information terminal 9201. FIG. 12D is a perspective view of an opened state of the portable information terminal 9201, FIG. 12F is a perspective view of a folded state thereof, and FIG. 12E is a perspective view of a state in the middle of change from one of FIG. 12D and FIG. 12F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

This embodiment can be combined with the other embodiments as appropriate.

REFERENCE NUMERALS

10A: display apparatus, 10B: display apparatus, 10C: display apparatus, 21: light, 21B: light, 21G: light, 21R: light, 22: light, 22a: light, 22b: light, 100A: display apparatus, 100B: display apparatus, 100C: display apparatus, 112: common layer, 114: common layer, 115: common electrode, 142: adhesive layer, 143: space, 145: transistor, 149: lens, 151: substrate, 152: substrate, 153: substrate, 154: substrate, 155: adhesive layer, 162: display portion, 164: circuit, 165: wiring, 166: conductive layer, 172: FPC, 173: IC, 183: active layer, 190: light-emitting device, 190B: light-emitting device, 190G: light-emitting device, 190R-PD: light-emitting and light-receiving device, 191: pixel electrode, 192: buffer layer, 192B: buffer layer, 192G: buffer layer, 192R: buffer layer, 193: light-emitting layer, 193B: light-emitting layer, 193G: light-emitting layer, 193R: light-emitting layer, 194: buffer layer, 194B: buffer layer, 194G: buffer layer, 194R: buffer layer, 195: protective layer, 198: object, 200: display apparatus, 201: transistor, 202: transistor, 204: connection portion, 205: transistor, 206: transistor, 207: transistor, 208: transistor, 209: transistor, 210: transistor, 211: insulating layer, 212: insulating layer, 213: insulating layer, 214: insulating layer, 215: insulating layer, 216: partition, 218: insulating layer, 221: conductive layer, 222a: conductive layer, 222b: conductive layer, 223: conductive layer, 225: insulating layer, 228: region, 231: semiconductor layer, 231i: channel formation region, 231n: low-resistance region, 242: connection layer, 251: substrate, 252: finger, 254: layer including a light-emitting and light-receiving device, 255: functional layer, 257: layer including a light-emitting device, 258: stylus, 259: substrate, 261: contact portion, 262: fingerprint, 263: image-capturing range, 266: path, 270B: light-emitting device, 270G: light-emitting device, 270R-PD: light-emitting and light-receiving device, 271: pixel electrode, 273: active layer, 275: common electrode, 277: first electrode, 278: second electrode, 280: display apparatus, 281: hole-injection layer, 282: hole-transport layer, 283B: light-emitting layer, 283G: light-emitting layer, 283R: light-emitting layer, 284: electron-transport layer, 285: electron-injection layer, 289: layer serving as both a light-emitting layer and an active layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: separate remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal This application is based on Japanese Patent Application Serial No. 2019-190224 filed on Oct. 17, 2019, the entire contents of which are hereby incorporated herein by reference.

The invention claimed is:

1. A display apparatus comprising:
a first device comprising:
a first pixel electrode and a common electrode; and
a first light-emitting layer between the first pixel electrode and the common electrode;
a second device comprising:
a second pixel electrode and the common electrode;
a second light-emitting layer between the second pixel electrode and the common electrode; and
an active layer between the second pixel electrode and the common electrode, the active layer comprising an organic compound;
a first lens over the first device; and
a second lens over the second device,
wherein the first device is configured to emit light of a first color to an outside of the display apparatus through the first lens,
wherein the second device is configured to emit light of a second color,
wherein the second device is configured to receive light of the first color from the outside of the display apparatus through the second lens and convert the light of the first color into an electric signal.

2. The display apparatus according to claim 1,
wherein the active layer is positioned over the second pixel electrode, and
wherein the second light-emitting layer is positioned over the active layer.

3. The display apparatus according to claim 1,
wherein the second light-emitting layer is positioned over the second pixel electrode, and
wherein the active layer is positioned over the second light-emitting layer.

4. The display apparatus according to claim 1,
wherein the second device further comprises a buffer layer, and
wherein the buffer layer is positioned between the second light-emitting layer and the active layer.

5. The display apparatus according to claim 1,
wherein the first device and the second device further comprise a common layer, and
wherein the common layer is positioned between the first pixel electrode and the common electrode and between the second pixel electrode and the common electrode.

6. The display apparatus according to claim 1, further comprising an adhesive layer and a substrate,
wherein the adhesive layer is positioned between the common electrode and the substrate, and
wherein a refractive index of the adhesive layer is smaller than a refractive index of the first lens.

7. The display apparatus according to claim 6,
wherein the first lens is positioned between the substrate and the adhesive layer and comprises a convex surface on the adhesive layer side.

8. The display apparatus according to claim 6,
wherein the first lens is positioned between the common electrode and the adhesive layer and comprises a convex surface on the adhesive layer side.

9. A display module comprising the display apparatus according to claim 1 and a connector or an integrated circuit.

10. An electronic device comprising:
the display module according to claim 9; and
at least one of an antenna, a battery, a housing, a camera, a speaker, a microphone, and an operation button.

* * * * *